United States Patent
Jain et al.

(10) Patent No.: US 12,243,913 B2
(45) Date of Patent: Mar. 4, 2025

(54) SELF-ALIGNED BACKSIDE CONTACT INTEGRATION FOR TRANSISTORS

(71) Applicant: International Business Machines Corporation, Armonk, NY (US)

(72) Inventors: Nikhil Jain, Apple Valley, MN (US); Sagarika Mukesh, Albany, NY (US); Devika Sarkar Grant, Amsterdam, NY (US); Prabudhya Roy Chowdhury, Albany, NY (US); Ruilong Xie, Niskayuna, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 17/652,113

(22) Filed: Feb. 23, 2022

(65) Prior Publication Data
US 2023/0268389 A1      Aug. 24, 2023

(51) Int. Cl.
*H01L 29/786*   (2006.01)
*H01L 23/48*    (2006.01)
(Continued)

(52) U.S. Cl.
CPC ........ *H01L 29/0665* (2013.01); *H01L 23/481* (2013.01); *H01L 29/0649* (2013.01);
(Continued)

(58) Field of Classification Search
CPC ............. H01L 29/0649; H01L 29/0665; H01L 29/41733; H01L 29/42392;
(Continued)

(56) References Cited

U.S. PATENT DOCUMENTS

| | | |
|---|---|---|
| 9,570,395 B1 | 2/2017 | Sengupta et al. |
| 10,586,765 B2 | 3/2020 | Smith et al. |

(Continued)

FOREIGN PATENT DOCUMENTS

| | | |
|---|---|---|
| CN | 113658953 A | 11/2021 |
| EP | 3940789 A1 | 1/2022 |

OTHER PUBLICATIONS

Notification of Transmittal of the International Search report and the Written Opinion of the International Searching Authority, or the Declaration, International Application No. PCT/EP2023/051141, Mar. 6, 2023, 10 pgs.

(Continued)

*Primary Examiner* — Hoai V Pham
(74) *Attorney, Agent, or Firm* — Yee & Associates, P.C.

(57) ABSTRACT

Provided is a semiconductor device. The semiconductor device comprises a transistor comprising a plurality of source/drain epitaxies. The semiconductor device further comprises at least one backside power rail under the transistor. The semiconductor device further comprises a backside inter-layer dielectric (ILD) located between the plurality of source/drain epitaxies and the at least one power rail. The semiconductor device further comprises a first backside contact connecting a first source/drain epitaxy to the at least one backside power rail. The semiconductor device further comprises one or more contact placeholders formed under the other source/drain epitaxies.

17 Claims, 22 Drawing Sheets

(51) Int. Cl.
   *H01L 29/06* (2006.01)
   *H01L 29/417* (2006.01)
   *H01L 29/423* (2006.01)
   *H01L 29/66* (2006.01)

(52) U.S. Cl.
   CPC .. *H01L 29/41733* (2013.01); *H01L 29/42392* (2013.01); *H01L 29/66742* (2013.01); *H01L 29/78618* (2013.01); *H01L 29/78696* (2013.01)

(58) Field of Classification Search
   CPC ......... H01L 29/66742; H01L 29/78618; H01L 29/78696
   USPC ....................................................... 257/502
   See application file for complete search history.

(56) References Cited

U.S. PATENT DOCUMENTS

| | | | |
|---|---|---|---|
| 10,636,739 B2 | 4/2020 | Beyne et al. | |
| 10,700,207 B2 | 6/2020 | Chen et al. | |
| 10,797,139 B2 | 10/2020 | Morrow et al. | |
| 10,950,546 B1 | 3/2021 | Doornbos | |
| 2018/0145030 A1 | 5/2018 | Beyne et al. | |
| 2020/0105671 A1 | 4/2020 | Lai et al. | |
| 2020/0279811 A1 | 9/2020 | Hong et al. | |
| 2021/0111115 A1 | 4/2021 | Morrow et al. | |
| 2021/0202472 A1 | 7/2021 | Thompson et al. | |
| 2021/0305381 A1 | 9/2021 | Chiang et al. | |
| 2021/0336012 A1 | 10/2021 | Huang et al. | |
| 2021/0351079 A1 | 11/2021 | Su et al. | |
| 2021/0376094 A1 | 12/2021 | Lin et al. | |
| 2022/0352326 A1* | 11/2022 | Huang | H01L 29/0673 |

OTHER PUBLICATIONS

Gelsinger, P., "Intel Accelerated," Presentation, 2021, https://download.intel.com/newsroom/2021/client-computing/Intel-Accelerated-2021-presentation.pdf, printed Jan. 11, 2022, 52 pgs.
Imec, "Imec Demonstrates Excellent Performance of Si FinFET CMOS devices with Integrated Tungsten Buried Power Rails," Press release, Jun. 15, 2020. https://www.imec-int.com/en/articles/imec-demonstrates-excellent-performance-of-si-finfet-cmos-devices-with-integrated-tungsten-buried-power-rails, printed Jan. 11, 2022, 13 pgs.

* cited by examiner

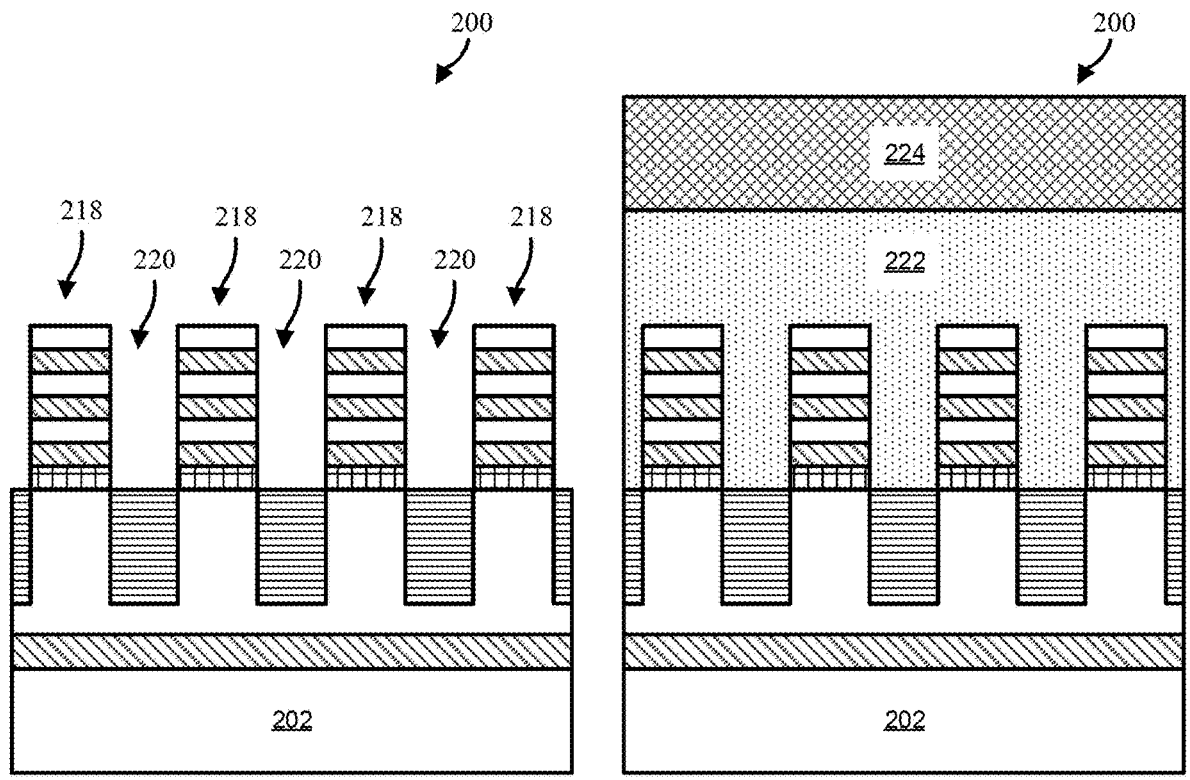
FIG. 4A
FIG. 4B
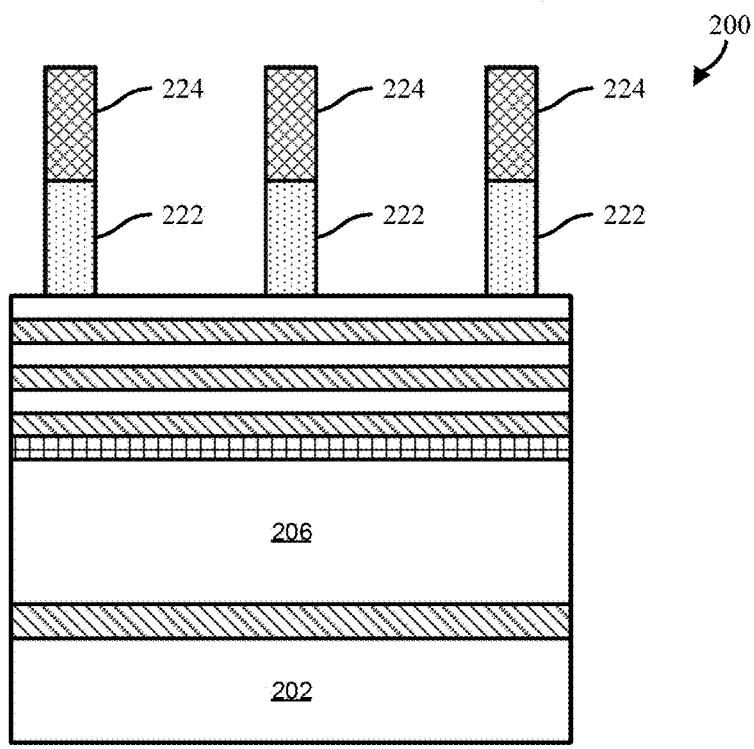
FIG. 4C

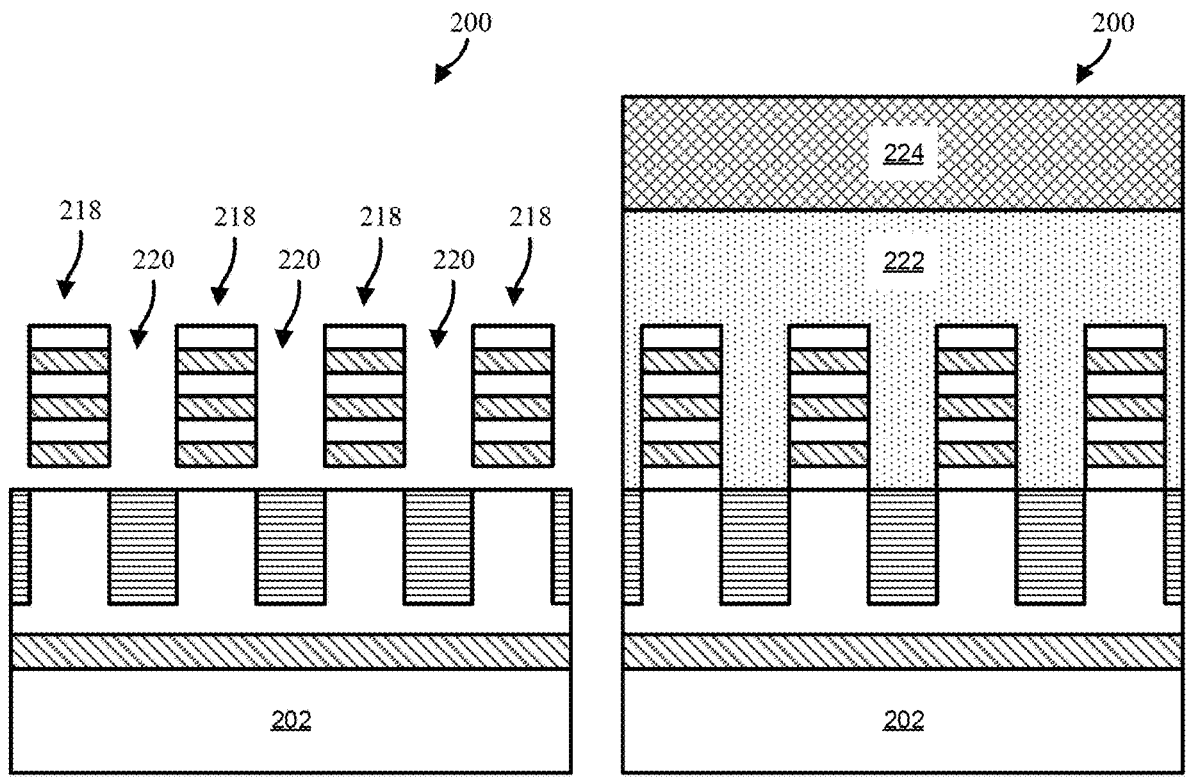
FIG. 5A
FIG. 5B
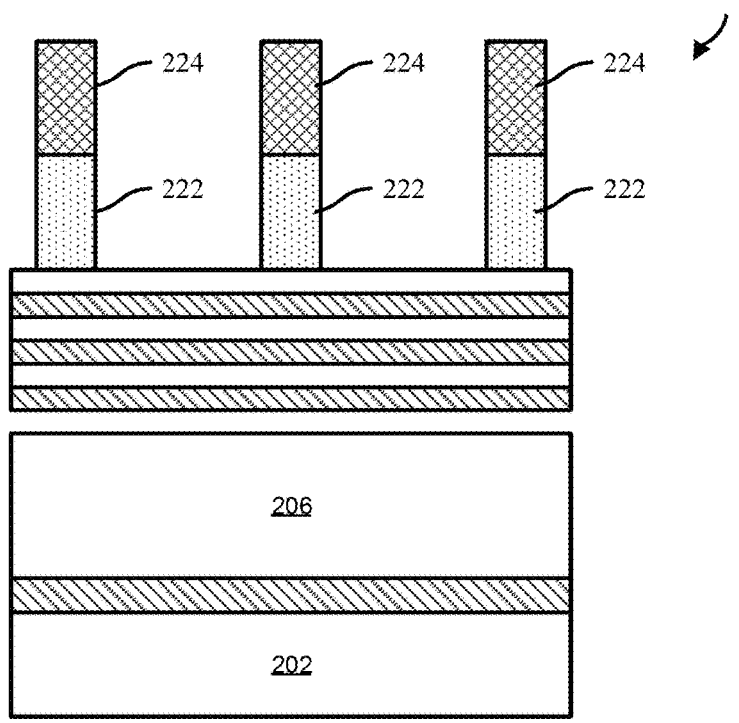
FIG. 5C

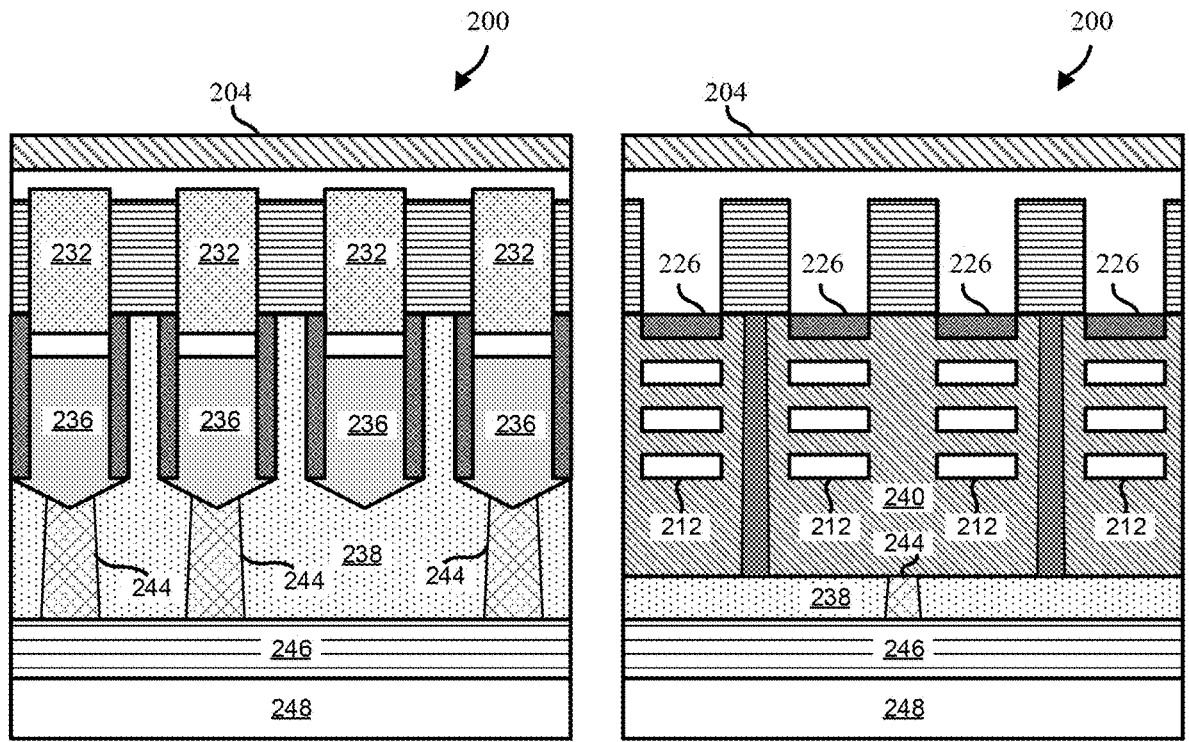
FIG. 14A
FIG. 14B
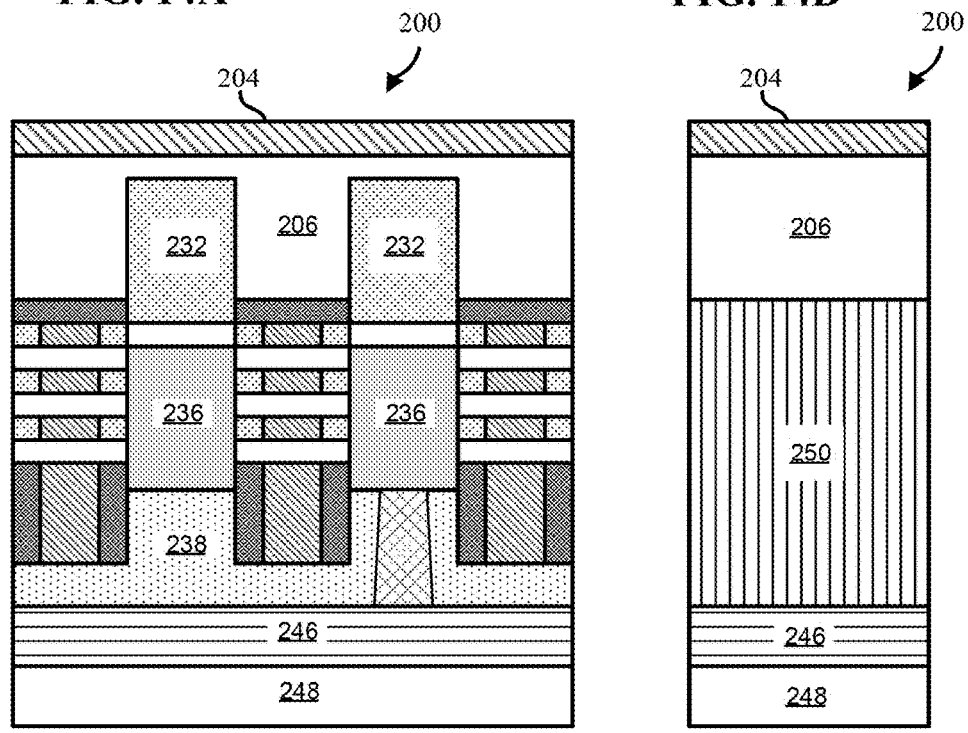
FIG. 14C
FIG. 14D

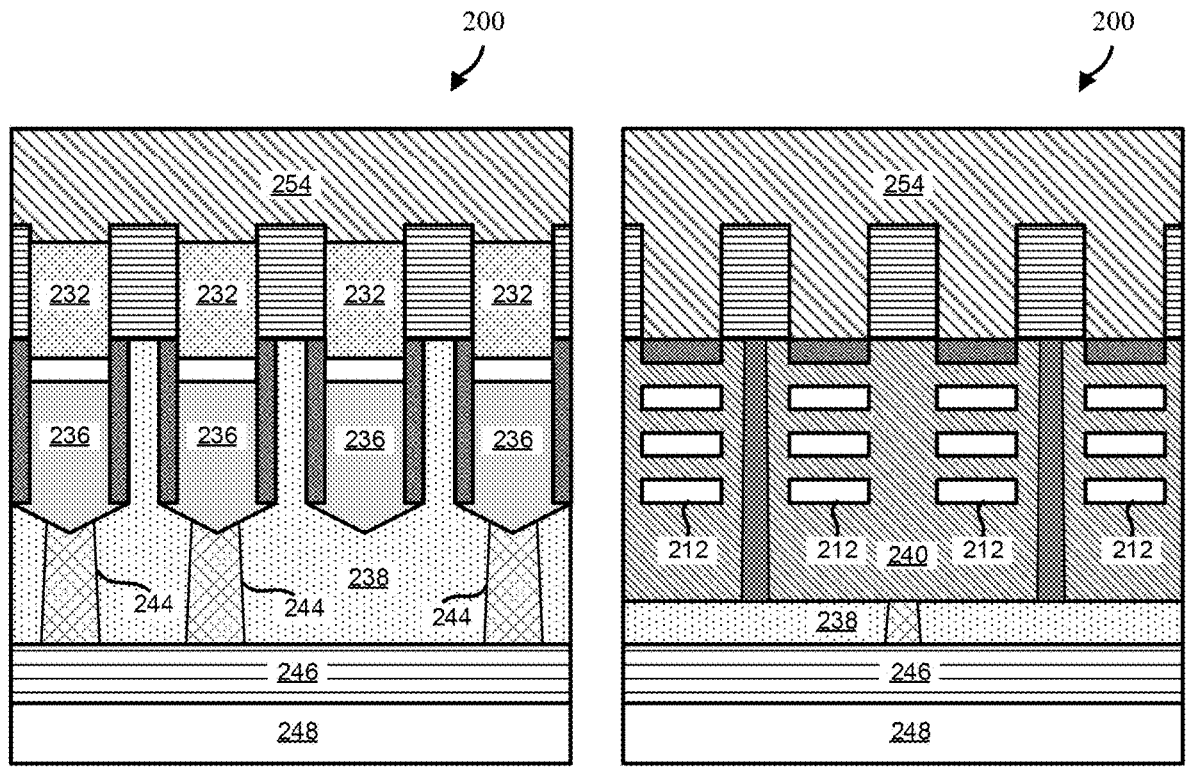
FIG. 17A
FIG. 17B
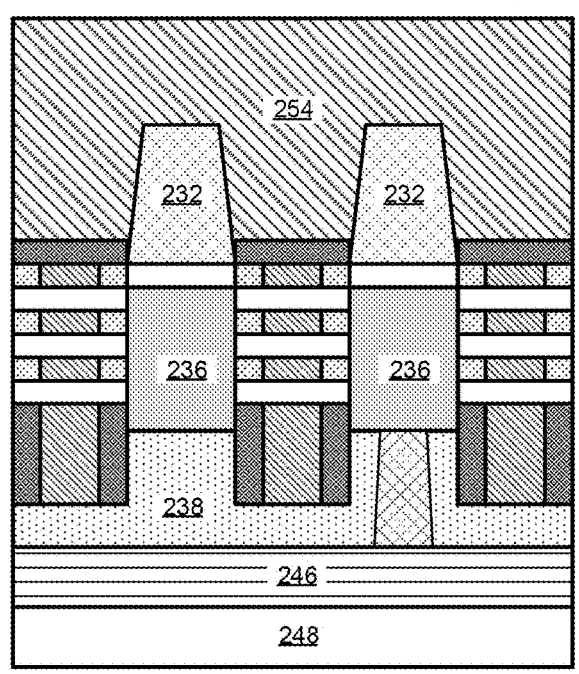
FIG. 17C
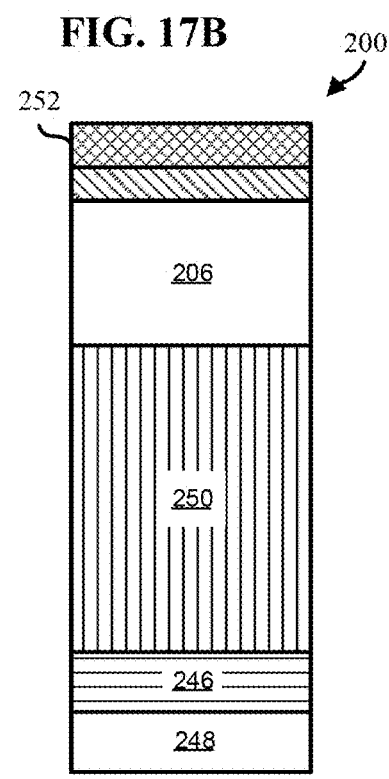
FIG. 17D

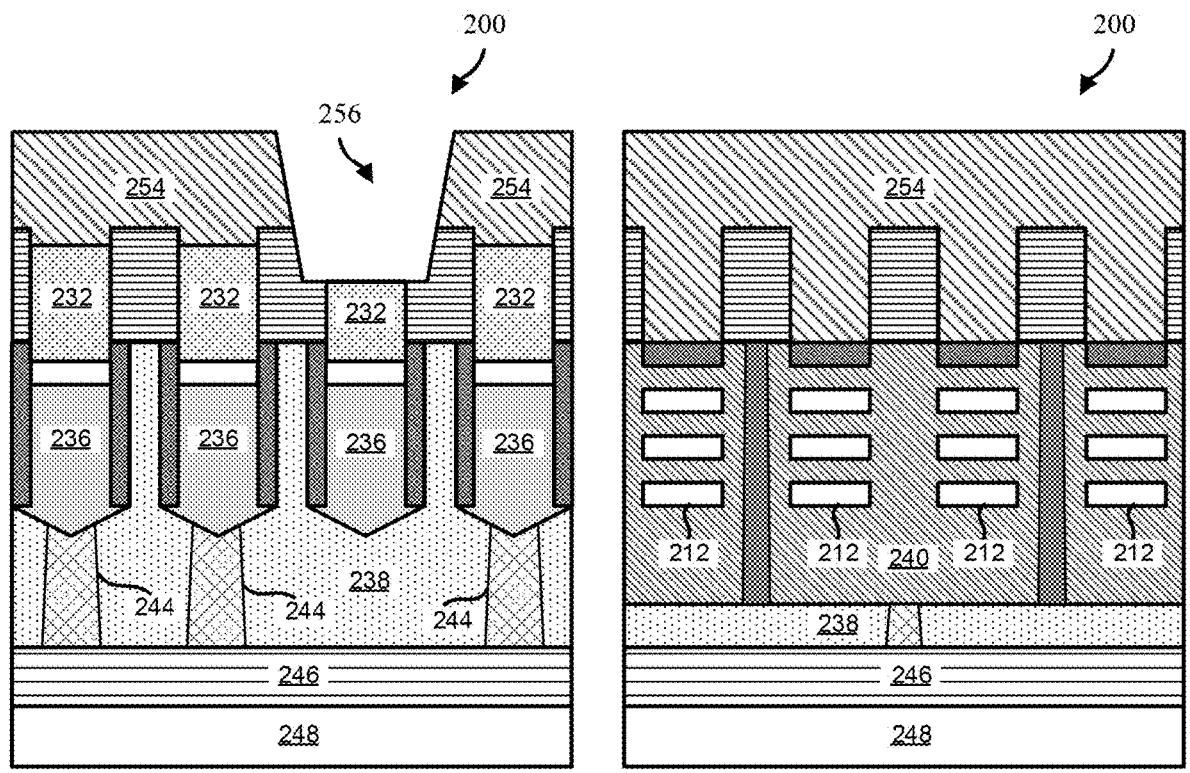
FIG. 18A
FIG. 18B
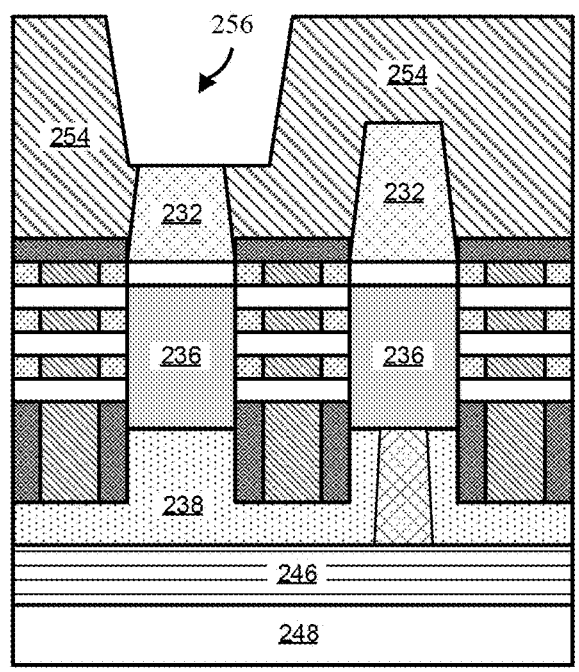
FIG. 18C
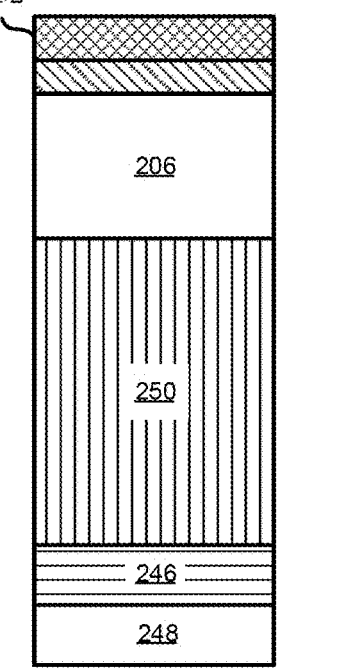
FIG. 18D

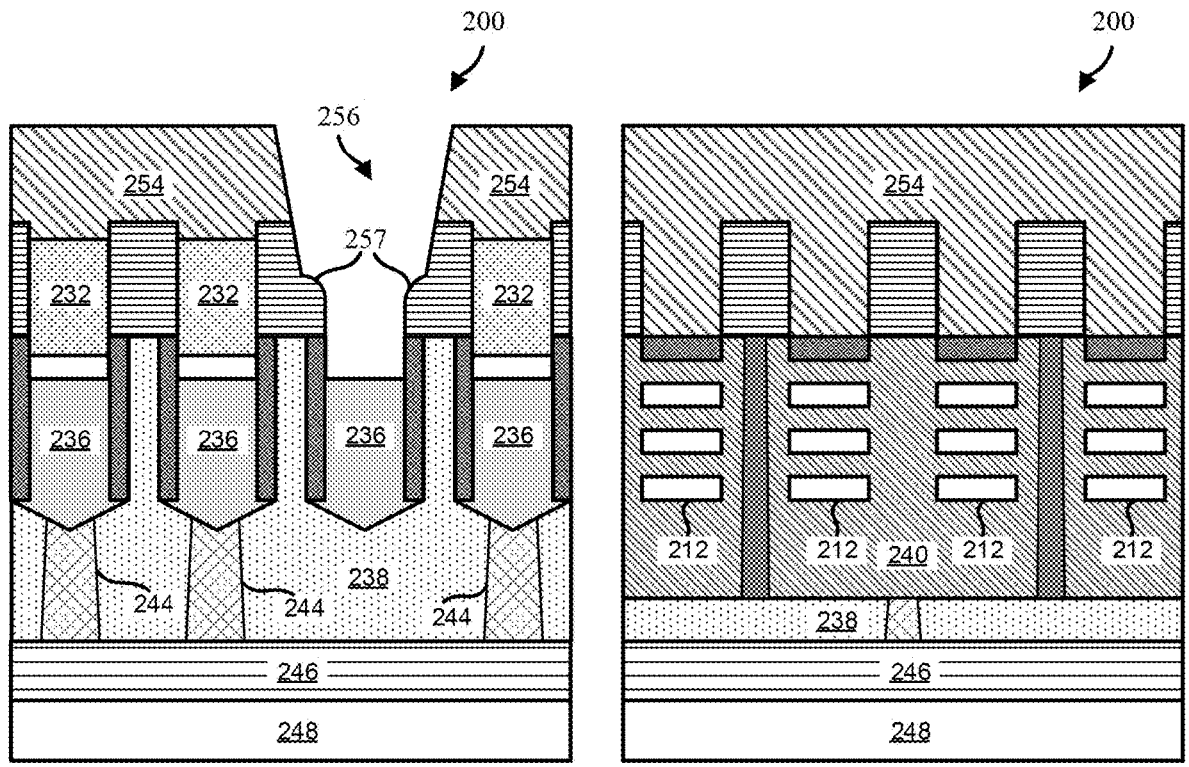
FIG. 19A
FIG. 19B
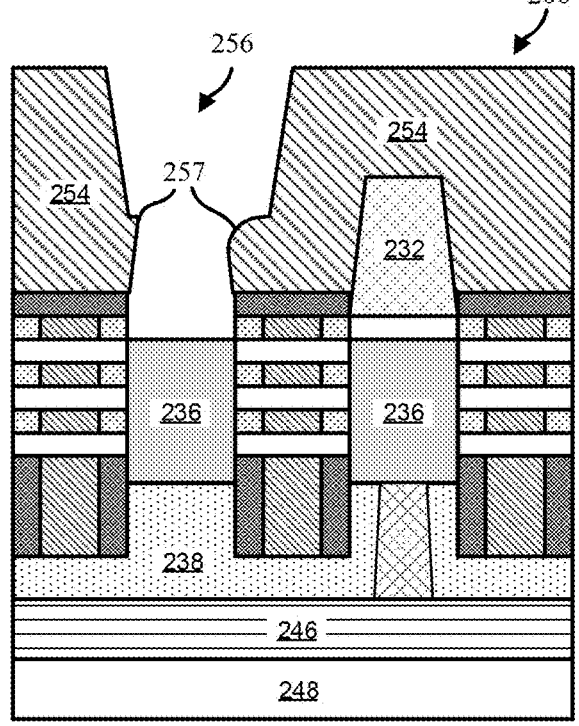
FIG. 19C
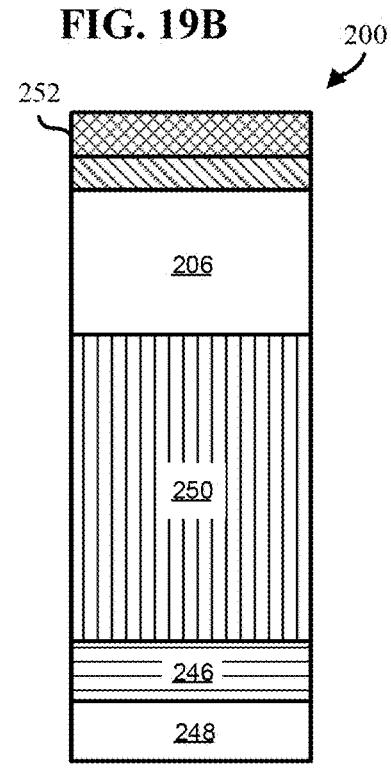
FIG. 19D

SELF-ALIGNED BACKSIDE CONTACT INTEGRATION FOR TRANSISTORS

BACKGROUND

The present invention relates in general to semiconductor fabrication methods and resulting structures. More specifically, the present invention relates to backside interconnects providing power delivery to field-effect-transistors of semiconductor devices and methods of forming the same.

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode via a power distribution network.

SUMMARY

Embodiments of the present invention include fabrication methods and the corresponding structures. Some embodiments of the present disclosure include a semiconductor device. The semiconductor device comprises a transistor comprising a plurality of source/drain epitaxies. The semiconductor device further comprises at least one backside power rail under the transistor. The semiconductor device further comprises a backside inter-layer dielectric (ILD) located between the plurality of source/drain epitaxies and the at least one power rail. The semiconductor device further comprises a first backside contact connecting a first source/drain epitaxy to the at least one backside power rail. The semiconductor device further comprises one or more contact placeholders formed under the other source/drain epitaxies.

Advantageously, the semiconductor device may overcome concerns with conventional designs. For example, unlike designs that have backside power distribution networks and frontside buried power rails, embodiments of the present disclosure do not overly restrict the size of the buried power rails. Additionally, unlike designs that use frontside VBPR to deliver power from the buried power rails to the transistors, embodiments of the present disclosure do not suffer from middle-of-line (MOL) congestion and/or routing limitations. Furthermore, embodiments of the present disclosure may allow source/drain epitaxy access to the M1 signal lines through other (e.g., neighboring) CMOS cells. Moreover, embodiments of the present disclosure can be fabricated using self-aligning processes to ensure a strong connection between the transistor's source/drain epitaxy and the buried backside power rails.

In an optional embodiments, the semiconductor device further includes a secondary device region. The secondary device region includes one or more other devices selected from the group consisting of an ESD diode, a BJT, and a passive device. Advantageously, embodiments of the present disclosure allow the transistor region and the secondary device region to integrate easily, with it being possible to fabricate the semiconductors and secondary devices at the same level.

In another optional embodiment, the first backside contact has a two-staged shape, wherein the first backside contact has a larger top critical dimensions (CD) and smaller bottom CD. Advantageously, the two-staged shape allows for easy self-alignment of the backside contact with the source/drain epitaxy.

In another optional embodiments, each source/drain epitaxy of the plurality of source/drain is either connected to a backside power rail through a backside contact or is connected to a contact placeholder. Advantageously, the use of contact placeholders on the source/drain epitaxies enables easy self-alignment of the backside contact, which can be formed by replacing one of the contact placeholders during fabrication of the backside power rails.

Further embodiments of the present disclosure include a nanosheet transistor. The nanosheet transistor includes a plurality of source/drain epitaxies. The nanosheet transistor further includes a backside ILD under the plurality of source/drain epitaxies. The nanosheet transistor further includes a first contact connecting a first source/drain epitaxy to a backside power rail, the first contact extending through the backside ILD. The nanosheet transistor further includes a contact placeholder in contact with a second source/drain epitaxy. The contact placeholder is disposed between the second source/drain epitaxy and the backside ILD.

Additional embodiments of the present disclosure include a semiconductor device. The device includes a backside power distribution network (BSPDN) and one or more backside power rails connected to the BSPDN. The device further includes an ILD above the one or more backside power rails, opposite the BSPDN. The device further includes one or more nanosheet transistors. Each nanosheet transistor comprises at least one backside contact that connects a first source/drain epitaxy of the respective nanosheet transistor to a backside power rail. The backside contact extends from the source/drain epitaxy through the backside ILD. Each nanosheet transistor further includes at least one placeholder contact connected to a second source/drain epitaxy.

Additional embodiments of the present disclosure include a fabrication method, system, and computer program product. The fabrication method comprises forming an etch stop layer on a substrate. The method further includes forming an Si epitaxy layer over the etch stop layer. The method further includes forming one or more transistor regions and one or more secondary device regions over the Si epitaxy layer. The method further includes forming backside contact placeholders under source/drain regions of the one or more transistors. The method further includes forming middle-of-line (MOL) and BEOL sections. The method further includes selectively removing the substrate to the etch stop layer. The method further includes removing the etch stop layer and the Si epitaxy layer from the one or more transistor regions. The method further includes forming a backside ILD. The method further includes forming one or more backside contacts through the backside ILD. The method further includes forming one or more backside power rails and a backside power distribution network over the one or more backside contacts.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIGS. 4A-4C illustrate cross-sectional views of the semiconductor device of FIG. 3 following the performance of additional fabrication operations, in accordance with embodiments of the present disclosure.

FIGS. 5A-5C illustrate cross-sectional views of the semiconductor device of FIGS. 4A-4C following the performance of additional fabrication operations, in accordance with embodiments of the present disclosure.

FIGS. 14A-14D illustrate cross-sectional views of the semiconductor device of FIGS. 13A-13C following the performance of additional fabrication operations, in accordance with embodiments of the present disclosure.

FIGS. 17A-17D illustrate cross-sectional views of the semiconductor device of FIGS. 16A-16D following the performance of additional fabrication operations, in accordance with embodiments of the present disclosure.

FIGS. 18A-18D illustrate cross-sectional views of the semiconductor device of FIGS. 17A-17D following the performance of additional fabrication operations, in accordance with embodiments of the present disclosure.

FIGS. 19A-19D illustrate cross-sectional views of the semiconductor device of FIGS. 18A-18D following the performance of additional fabrication operations, in accordance with embodiments of the present disclosure.

Figure 1:
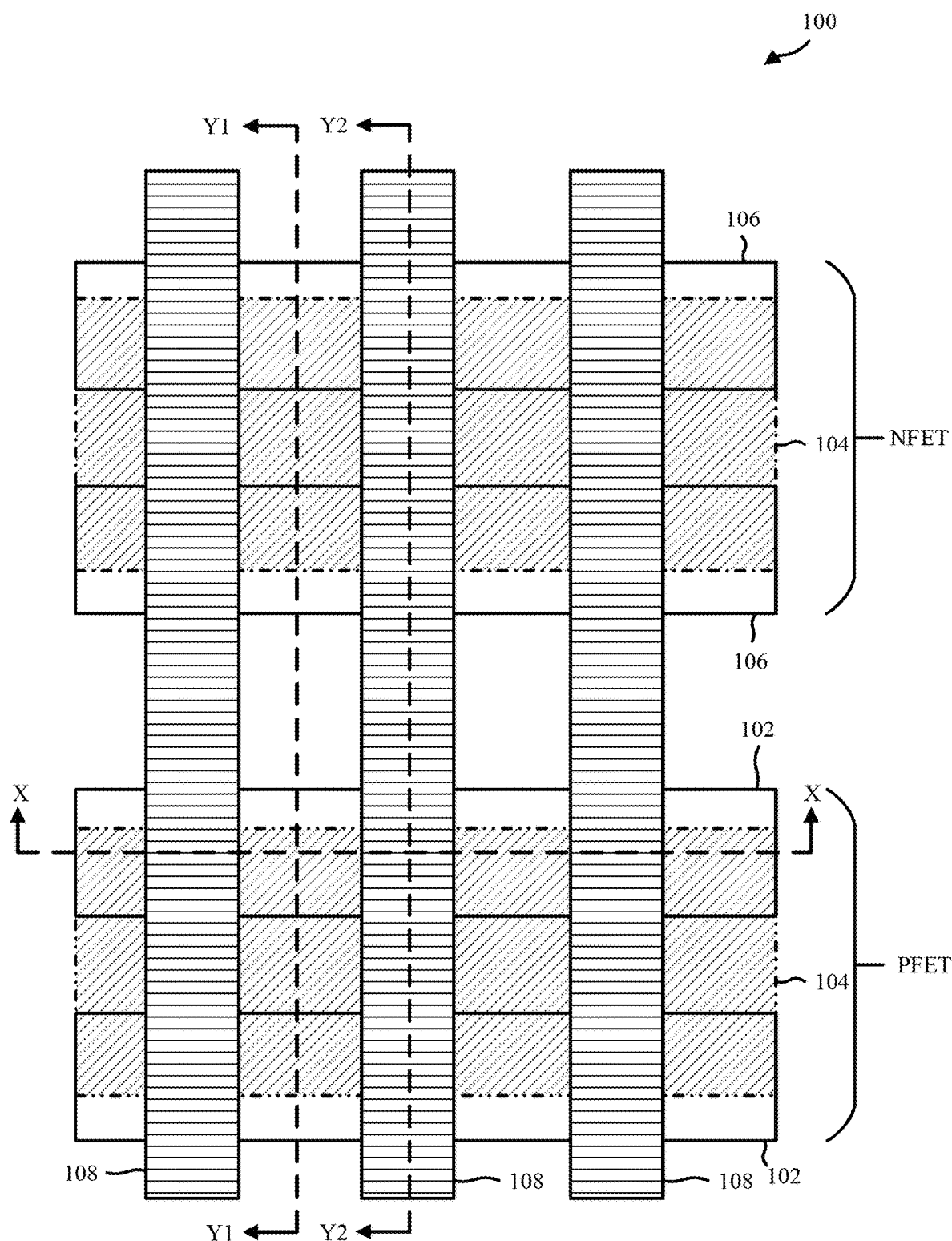
FIG. 1 depicts a plan view of an example nanosheet transistor indicating a Y1 cross-section location, a Y2 cross-section location, and an X cross section location for the following figures, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to backside interconnects providing power delivery to field-effect-transistors of semiconductor devices and methods of making the same. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects in any and all possible combinations as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of +8% or 5%, or 2% of a given value.

For purposes of the description hereinafter, when a first surface is referred to as being arranged "opposite" to a second surface, the first surface is different from the second surface, and the first surface is spaced apart from the second surface. For instances in which the surfaces are substantially planar, the first surface is substantially parallel to the second surface.

It is to be understood that as used herein, "an embodiment" means one or more embodiments that share a common aspect. For example, "a first embodiment" may include one or more embodiments that are related in that they all share a first common aspect, function, and/or feature. Likewise, "a second embodiment" may include one or more embodiments that are related in that they all share a second common aspect, function, and/or feature. Furthermore, a particular embodiment that has both the first common aspect, function, and/or feature and the second common aspect, function, and/or feature may be considered to be both a first embodiment and a second embodiment.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, an integrated circuit (IC) is a set of electronic circuits on one small flat piece (or "chip") of semiconductor material. More specifically, large numbers of tiny transistors can be integrated into a small chip, and interconnects can be used to connect two or more circuit elements (such as transistors) on the chip together electrically. Interconnects can also be used to provide power to the transistors through a power distribution network (PDN) that utilizes buried power rails and via-to-buried power rails (VBPRs). This results in circuits that are orders of magnitude smaller, faster, and less expensive than those constructed of discrete electronic components.

The field-effect transistor (FET) is a type of transistor that uses an electric field to control the flow of current in a semiconductor. FETs are devices with three terminals: a source, a gate, and a drain. FETs control the flow of current by the application of a voltage to the gate, which in turn alters the conductivity between the drain and source. More specifically, the FET controls the flow of electrons (or holes) from the source to drain by affecting the size and shape of a conductive channel created and influenced by voltage (or lack of voltage) applied across the gate and source terminals. (For simplicity, this discussion assumes that the body and source are connected.) This conductive channel is the stream through which electrons flow from source to drain.

FETs are also known as unipolar transistors since they involve single-carrier-type operation. In other words, a FET uses either electrons or holes as charge carriers in its operation, but not both. The source/drain of a FET is doped to produce either an n-type semiconductor (in which case the FET can be referred to as an NFET) or a p-type semiconductor (in which case the FET can be referred to as a PFET). When the voltage applied to the gate of the FET is larger than the threshold voltage, the charge carriers in the channel region of the FET are built up, which activates the FET (e.g., allowing current to flow between the source and the drain).

Many different types of field effect transistors exist. A gate-all-around (GAA) FET is a non-planar (3D) transistor designed such that the gate material surrounds the channel region on all sides. Accordingly, the contact between the gate and the channel is increased, which provides better electrical control over the channel. A GAAFET can be a PFET or an NFET. A gate-all-around n-type semiconductor may also be referred to herein as a GAA NFET. Similarly, a gate-all-around p-type semiconductor may also be referred to herein as a GAA PFET.

A nanosheet transistor is a type of GAA transistor in which one or more sheets of semiconductor material (e.g., Si) are used to create the transistor channels which are surrounded by the gate. As such, the gate is able to surround each sheet on all sides, thereby increasing the contact between the gate and the channel. Furthermore, the more nanosheets used by a transistor, the more contact surface area the gate has with the channel. This provides excellent control of current leakage within the transistor. Nanosheet transistors may be vertically aligned, with a bottom source/drain disposed below the nanosheets (e.g., between the nanosheets and the substrate) and a top source/drain disposed on the top of the nanosheets (opposite the bottom source/drain), or they may be horizontally aligned (e.g., a horizontal-transport GAAFET), where the current travels from the source to the drain in a horizontal direction.

In some embodiments, nanosheets of opposite polarity are horizontally arranged side-by-side. For example, a GAA PFET can be arranged next to a GAA NFET. Once arranged, a pair including a GAA PFET and an GAA NFET can be functionally interconnected and utilized as a complementary metal-oxide-semiconductor (CMOS) cell. In a CMOS cell, complementary pairs of PFETs and NFETs are used for logic functions.

Three approaches may be used for providing wiring front-end-of-line (FEOL) devices to the backside of the wafer, such as to provide power delivery from a backside power distribution network (PDN). The first approach utilizes a frontside VBPR, a frontside buried power rail, and a backside PDN, the second approach utilizes a frontside VBPR, a backside buried power rail (also referred to herein simply as a backside power rail (BPR)), and a backside PDN, and the third approach (referred to herein as the direct backside contact approach), which embodiments of the present disclosure include, utilizes a backside VBPR, a backside BPR, and a backside PDN.

The first and second approaches have numerous drawbacks. For example, in the first approach, the size of the BPR is limited, which can increase the resistance of the BPR. Furthermore, both the first and second approaches suffer middle-of-line (MOL) congestions and routing limitations due to them having extended source/drain (S/D) contacts (CAs) and VBPRs. Additionally, the first and second approaches only allow the S/D epitaxy access to the M1 (metal layer 1) signal lines though vias within the same CMOS cell.

Embodiments of the present disclosure may overcome these and other drawbacks of existing solutions. Embodiments of the present disclosure include a semiconductor device comprising a transistor (e.g., a complementary FET (CFET)) in, for example, a transistor region of the semiconductor device. A backside power rail is connected to the S/D epitaxy of the transistor through a backside contact. Under the transistor region of the semiconductor device, a backside inter-layer dielectric (ILD) is formed between the shallow trench isolation (STI) regions under the channels of the transistor. Additionally, a sacrificial contact placeholder is formed under the S/D epitaxies. The backside contact is formed through the backside ILD and the sacrificial contact placeholder to the S/D epitaxy.

In some embodiments, the semiconductor device may further include another device region for one or more other devices, referred to herein as a secondary device region. For example, the secondary device region may include an electrostatic discharge (ESD) diode, a bipolar junction transistor (BJT), or a passive device built on the bulk substrate. In some embodiment, in the secondary device region, a Si substrate may be underneath the frontside device (not a backside ILD). In some embodiments, an etch stop layer (e.g., SiGe or $SiO_2$) is underneath the Si substrate in the secondary device region.

In some embodiments, a bottom dielectric isolation (BDI) layer exists between the backside ILD and the gate stack of the transistor. The BDI may be any suitable dielectric material including, for example, $SiO_2$, SiOCN, SiOC, or SiBCN. The BDI may help protect against gate metal damage during the backside Si removal.

In some embodiments, the backside contact has a two-staged shape. The backside contact may have a larger top critical dimension (CD) and a smaller bottom CD. In some embodiments, creation of a backside contact with a two-staged shape may provide increased flexibility to route the device in different M1 tracks to avoid local congestion. Moreover, forming a two-staged backside contact enables self-alignment of the contact since the top, larger portion can be misaligned, but the backside contact will still be effective due to the bottom portion having been fabricated in a self-aligning process.

Embodiments of the present disclosure further include a method of manufacturing a semiconductor device. The method comprises forming an etch stop layer in the substrate and an Si epitaxy layer over the etch stop layer. The method further comprises forming both transistor regions and secondary device regions over the Si epitaxy layer. The method further comprises forming backside contact placeholder(s) under the S/D regions of the transistors. The method further comprises forming MOL, BEOL, and carrier wafer boding. The method further comprises flipping the wafer and removing the substrate stopping on the etch stop layer. The method further comprises removing the etch stop layer and the remaining Si epitaxy layer between the contact placeholder and the STI. The method further comprises forming the backside ILD. The method further comprises forming the backside self-aligned contact, BPR, and backside power distribution network (BSPDN).

Turning now to the figures, FIG. 1 depicts a plan view of an example semiconductor device 100 indicating a Y1 cross-section location, a Y2 cross-section location, and an X cross section location for the following figures, in accordance with embodiments of the present disclosure. The semiconductor device 100 includes a NFET region disposed next to a PFET region. Metal gates 108 may cross the NFET and PET regions. The NFET region includes two NFET nanosheet transistors 106 and a BPR 104. Likewise, the PFET region includes two PFET nanosheet transistors 102 and a backside power rail (BPR) 104. As such, FIG. 1 may show four nanosheet transistors (2 PFET and 2 NFET transistors).

Furthermore, complementary pairs of PFET nanosheet transistors and NFET nanosheet transistors may be coupled together to create one or more CMOS cells. For example, the NFET transistor at the bottom of the NFET region may be paired with the PFET transistor at the top of the PFET region to create a CMOS cell.

The BPRs 104 may lie on a different level of the semiconductor device 100 and substantially overlap the NFET nanosheet transistors 106 and the PFET nanosheet transistors 102. In other words, the BPR 104 may be below (for example) the NFETs and PFETs, as is illustrated by the dashed-and-dotted lines representing the edges of the BPR 104 substantially overlapping with the nanosheet transistors 102, 106.

FIG. 1 also shows the location of the cross-sectional cuts that are illustrated in FIGS. 2-20D. Cut Y1 runs across the nanosheet transistors in the source/drain epitaxy region, cut Y2 runs across the nanosheet transistors in the gate region, and cut X runs along a length of a single nanosheet 102 and crosses three gates 108. The subsequent figures show cross-sectional views along these cuts Y1, Y2, and X after particular fabrication operations.

FIGS. 2-20D show a fabrication process for fabricating a semiconductor device 200 having a self-aligned backside contact integration. In particular, FIGS. 2-20D show the semiconductor device 200 at various stages in the process, with each figure building on the previous figure. For example, FIG. 3 shows the semiconductor device 200 of FIG. 2 after subsequent fabrication operations have been performed, FIGS. 4A-4C show the semiconductor device 200 of FIG. 3 after subsequent fabrication operations have been performed, and so on.

Additionally, figures that share the same number (e.g., FIG. 4A, FIG. 4B, and FIG. 4C) show the semiconductor device at the same point in time. In other words, each figure that shares a number shows the various views of the semiconductor device after the same set of fabrication operations have been performed.

Furthermore, figures having the same letter following the number show the same cross-sectional cut at different stages. In particular, FIGS. 2, 3, and the subsequent figures that end in 'A" (e.g., FIG. 4A, FIG. 5A, FIG. 6A, etc.) show cross-section views along the Y1 cut (i.e., the inter-gate region or active region) as the fabrication process proceeds. Likewise, figures that end in 'B' (e.g., FIG. 4B, FIG. 5B, FIG. 6B, etc.) show cross-sectional views along the Y2 cut (i.e., the gate region), and figures that end in 'C' (e.g., FIG. 4C, FIG. 5C, FIG. 6C, etc.) show cross-sectional views along the X cut at the various stages. Figures that end in 'D' (e.g., FIG. 14D, FIG. 15D, FIG. 16D, etc.) show cross-sectional views of a different area (a secondary device region) of the semiconductor device 100 that are not visible in FIG. 1, which focuses on the transistor region of the semiconductor device 100.

Figure 2:
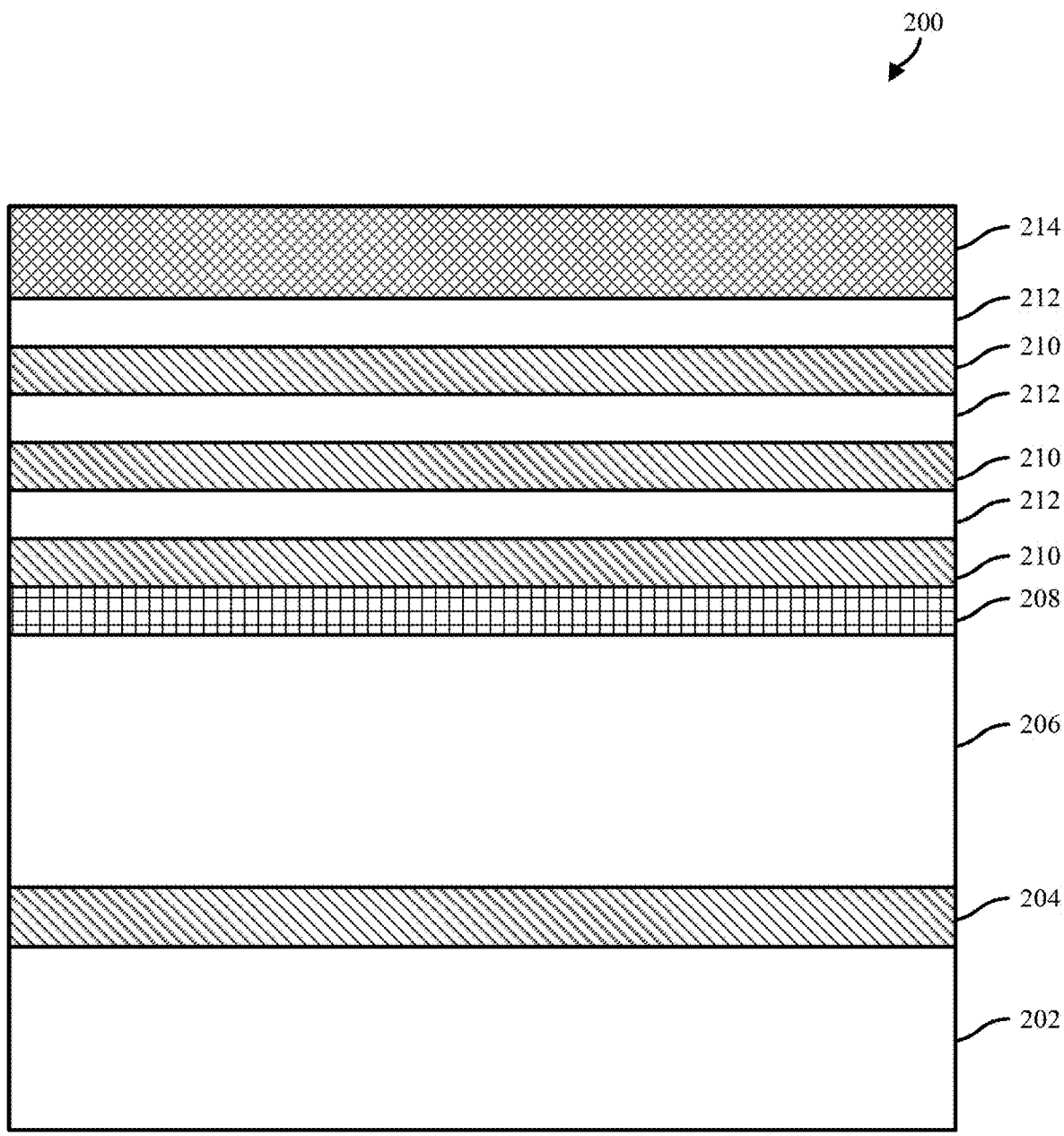
FIG. 2 illustrates a cross-sectional view of an example semiconductor device at an intermediate stage in the fabrication process, in accordance with embodiments of the present disclosure.
Figure 3:
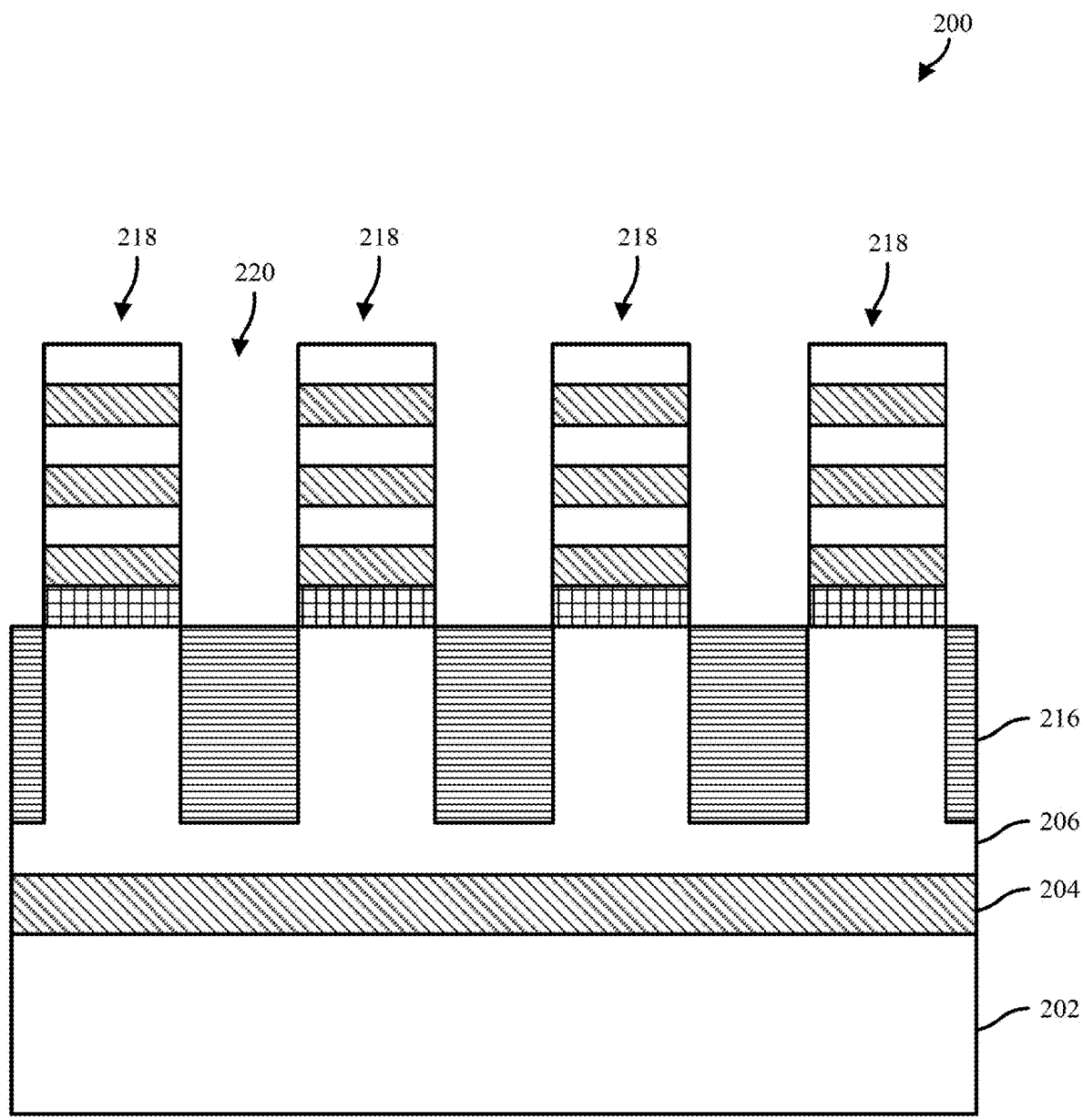
FIG. 3 illustrates a cross-sectional view of the example of the semiconductor device of FIG. 2 following the performance of additional fabrication operations, in accordance with embodiments of the present disclosure.

Referring now to FIG. 2, illustrated is a cross-sectional view of an example semiconductor device 200 at an intermediate stage in the fabrication process, in accordance with embodiments of the present disclosure. In particular, FIG. 2 illustrates the semiconductor device 200 after the formation of an initial, or starting, semiconductor stack on a wafer. The semiconductor stack comprises a first sacrificial layer 204 deposited on top of a substrate 202. The first sacrificial layer 204 may be, for example, a sacrificial low-Ge % SiGe such as, for example, SiGe30%. The first sacrificial layer 204 will act as an etch stop when removing the substrate 202 in subsequent fabrication operations. As such, in some embodiments, the first sacrificial layer 204 may be BOX $SiO_2$ if the starting wafer is a SOI wafer.

A semiconductor (e.g., Si) layer 206 (e.g., a Si epitaxy layer) is deposited on top of the first sacrificial layer 204. A second sacrificial layer 208 is then deposited on top of the semiconductor layer 206. The second sacrificial layer 208 may be a sacrificial high-Ge % SiGe layer such as, for example, SiGe55%.

Alternating layers of a third sacrificial material 210 and a semiconductor (e.g., Si) 212 may then be stacked on top of the second sacrificial material layer. The third sacrificial material 210 may be a sacrificial low-Ge % SiGe such as, for example, SiGe30%. The layers of the semiconductor 212 will end up being the nanosheet layers that make up the semiconductor channel for the semiconductor device 200.

After creating the nanosheet stack, a hardmask 214 may be deposited on a portion of the stack. After depositing the hardmask 214 on the semiconductor device 200, the nanosheet stack may be patterned. This is shown in FIG. 3. Patterning the nanosheet stack may include performing, for example, an extreme ultraviolet lithography (EUV) and/or an RIE operation to create a plurality of nanosheet structures (referred to herein as fins 218) separated by trenches 220.

Additionally, a shallow trench isolation (STI) layer 216 is formed in portions of the substrate semiconductor layer 206 that are lateral to the patterned stack. The STI 216 may prevent electric current leakage between the adjacent semiconductor components (e.g., between adjacent nanosheet FETs). In some embodiments, the STI 216 may be an oxide.

After forming the fins 218 and the STI 216, dummy gates 222 may be formed on the semiconductor device 200. This is shown in FIGS. 4A-4C. In particular, dummy gates 222 may be formed in the gate region along cut Y2, as shown in FIG. 4B. The dummy gates 222 may be made of any suitable material as would be recognized by a person of ordinary skill in the art. In some embodiments, the dummy gates 222 are a thin layer of SiO2 followed by bulk amorphous silicon (a-Si). A hardmask 224 may also be formed on top of the dummy gates 222.

After forming the dummy gates 222 and hardmask 224, the second sacrificial layer 208 may be selectively removed. This is shown in FIGS. 5A-5C. In particular, the second sacrificial layer 208 may be selectively removed without removing the first sacrificial layer 204 or the third sacrificial material 210. As shown in FIGS. 5A-5C, the second sacrificial layer 208 may be removed from the entire semiconductor device 200, including the inter-gate region (shown in FIG. 5A), the gate region (shown in FIG. 5B), and the nanosheet region (shown in FIG. 5C).

Figure 6A:
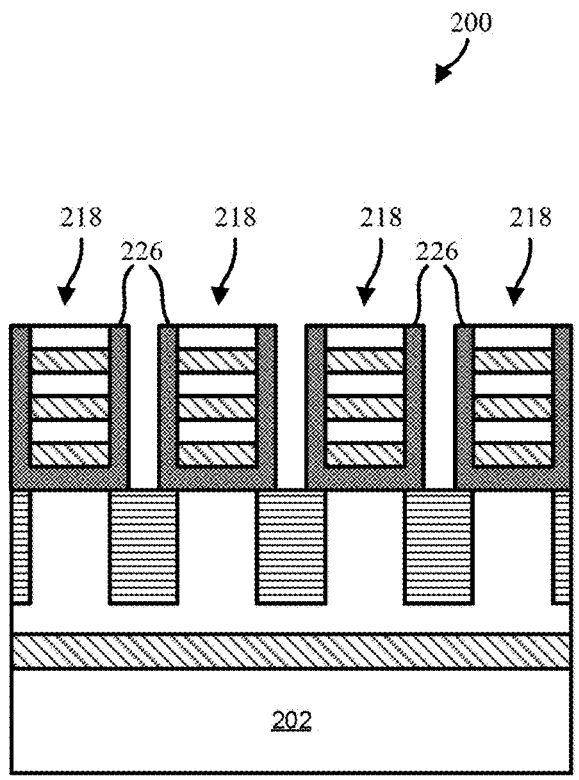
FIGS. 6A-6C illustrate cross-sectional views of the semiconductor device of FIGS. 5A-5C following the performance of additional fabrication operations, in accordance with embodiments of the present disclosure.
Figure 6B:
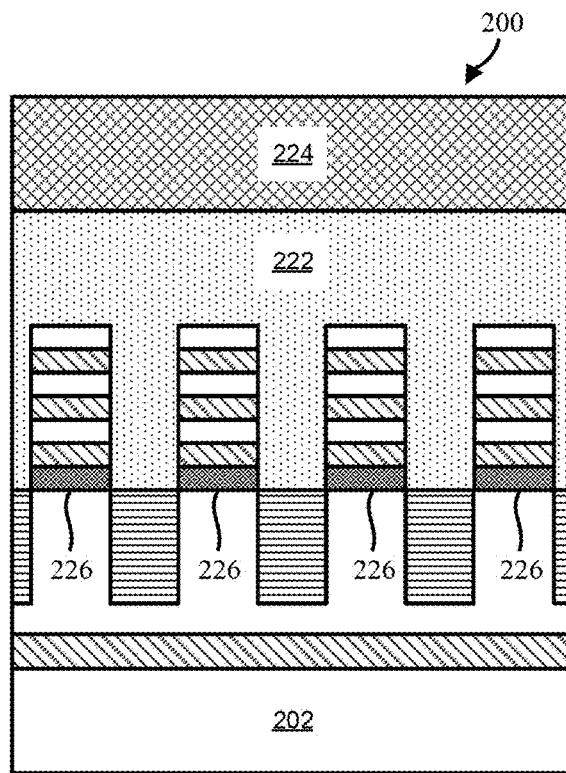
Figure 6C:
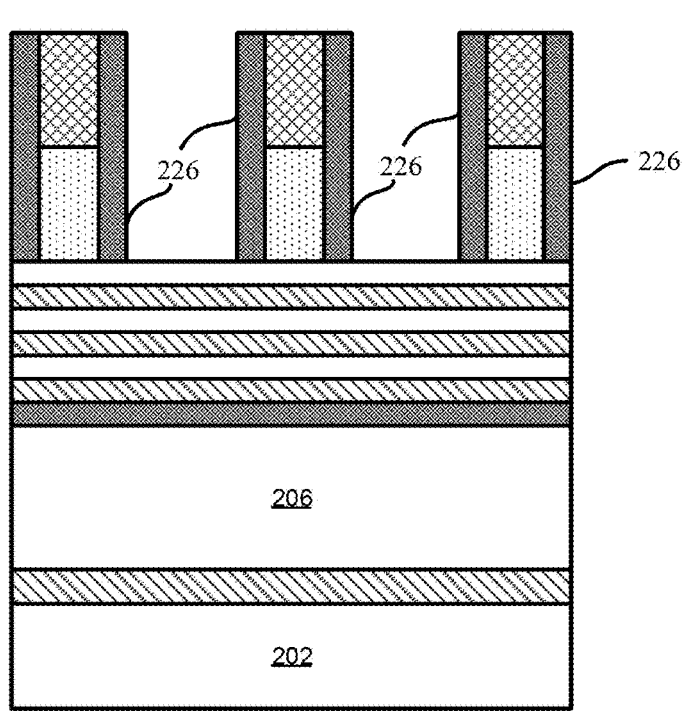

After removing the second sacrificial layer 208, one or more spacer layers 226 may be formed on the semiconductor device 200. This is shown in FIGS. 6A-6C. The one or more spacer layers 226 may include a bottom dielectric isolation (BDI) layer and one or more sidewall spacers. The BDI layer may be that part of the spacer layers 226 that sit between the semiconductor layer 206 and the fins 218. The BDI layer may be deposited where the second sacrificial layer 208 was previously found, as shown in FIGS. 6A and 6B. Additionally, the spacer sidewalls may be deposited along the walls of the exposed fins 218, as shown in FIG. 6A, as well as along the sidewalls of the dummy gates 222 and the hardmask 224, as shown in FIG. 6C.

The spacer layers 226 may be made out of, for example, SiO2, SiOCN, SiOC, SiBCN. The spacer layers 226 may be deposited on the semiconductor device 200 after removal of the second sacrificial layer 208. In some embodiments, a spacer RIE operation may be performed to remove the spacer layer 414 from on top of the STIs 216 and the fins 218.

Figure 7A:
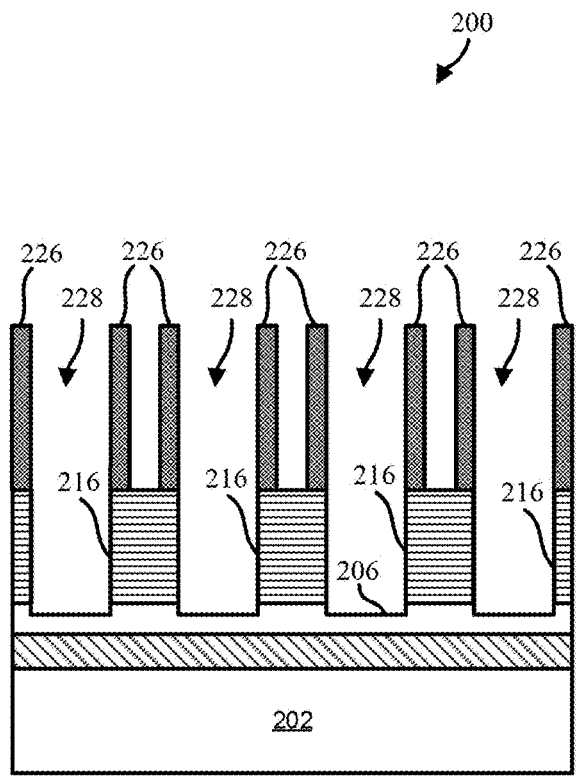
FIGS. 7A-7C illustrate cross-sectional views of the semiconductor device of FIGS. 6A-6C following the performance of additional fabrication operations, in accordance with embodiments of the present disclosure.
Figure 7B:
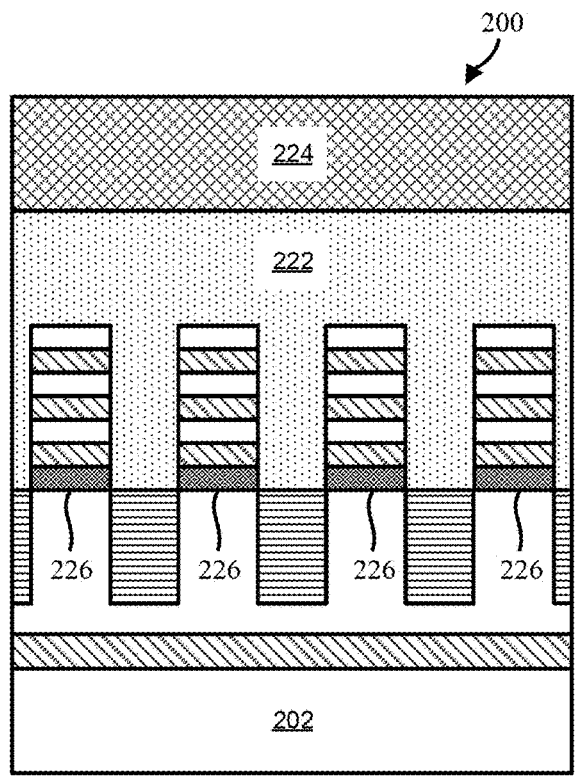
Figure 7C:
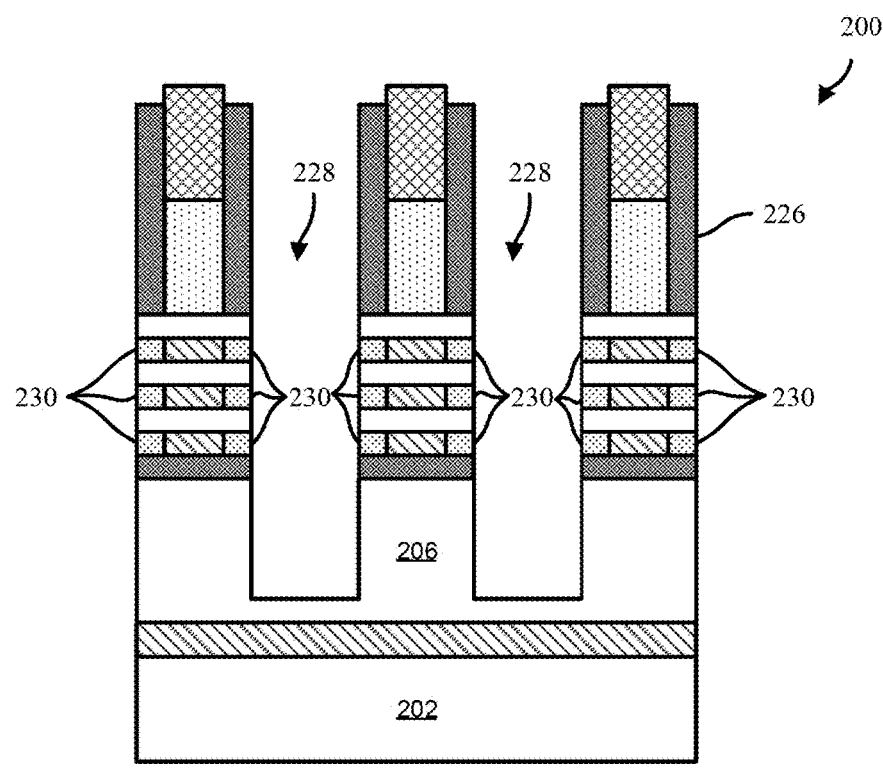

After forming the one or more spacer layers 226, a nanosheet recess operation may be performed. This is shown in FIGS. 7A-7C. The nanosheet recess operation may include performing a selective etching operation that removes the fins 218 and a portion of the semiconductor layer 206 below the fins, resulting in a plurality of trenches 228, as shown in FIGS. 7A and 7C. However, the spacer sidewalls 226 and the STI 216 are largely unaffected by the selective etching operation, though the spacer material may be etched such that it is slightly shorter and/or thinner than prior to etching, as can be seen in FIG. 7C (e.g., the top of the spacer 226 is no longer coplanar with the top of the hardmask 224). A result of the selective etching is that the sidewalls of the STI 216 and a top of the semiconductor layer 206 between the STI layers 216 are exposed.

In FIG. 7C, the hardmask 224 and the spacer layers 226 act to largely protect the semiconductor stack below the hardmask 224 and the spacer layers 226, while the portion of the semiconductor stack between the spacer layers 226 are etched down into the semiconductor layer 206. However, the recess operation (or a subsequent SiGe indentation operation) does result in exposed portions of the third sacrificial layers 210 in the trenches 228 being partially etched back. An inner spacer 230 is then formed where the third sacrificial layers 210 were etched back. The inner spacer 230 may be made out of, for example, SiO2, SiOCN, SiOC, SiBCN.

Figure 8A:
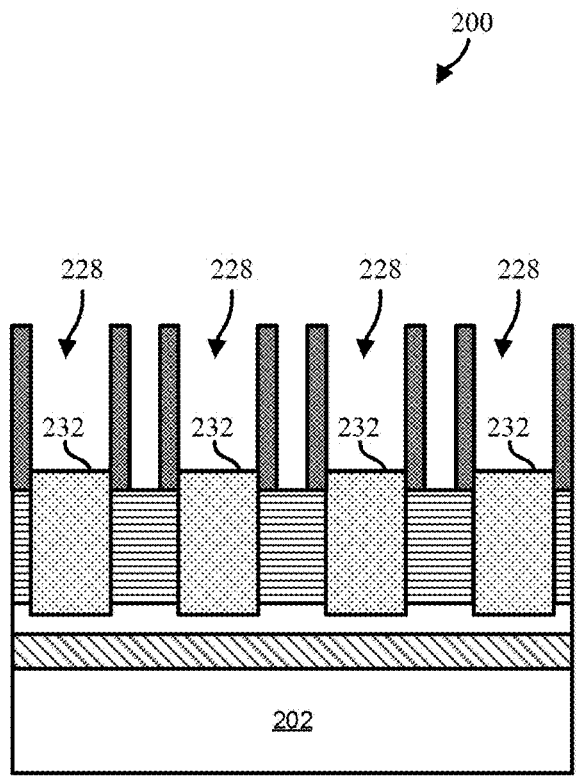
FIGS. 8A-8C illustrate cross-sectional views of the semiconductor device of FIGS. 7A-7C following the performance of additional fabrication operations, in accordance with embodiments of the present disclosure.
Figure 8B:
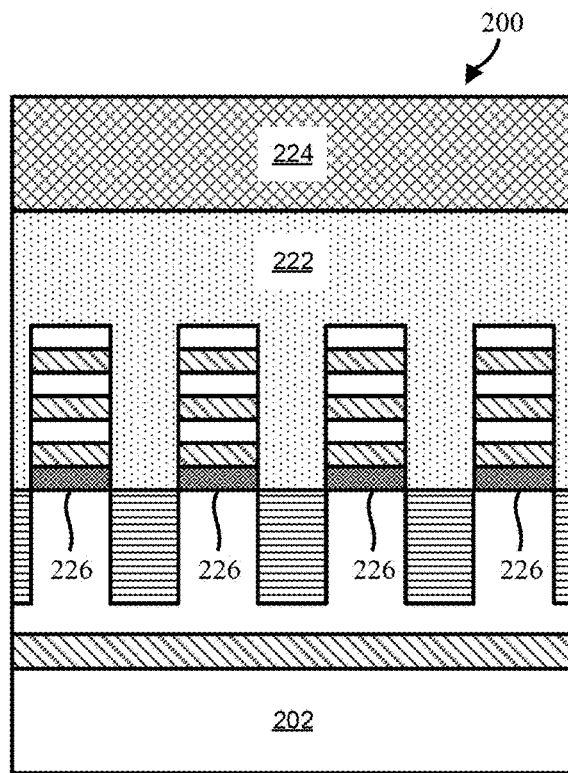
Figure 8C:
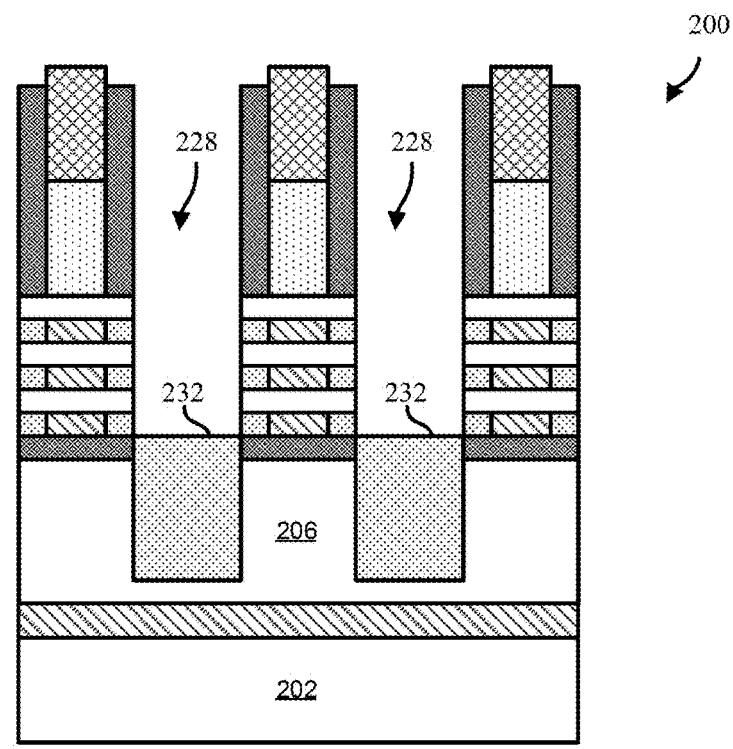

Next, a bottom-up epitaxy growth for a sacrificial placeholder 232 (e.g., SiGe) is performed. This is shown in FIGS. 8A-8C. The epitaxy sacrificial placeholder 232 growth may be formed in the trenches 228 between the spacer sidewalls 226 in the inter-gate region (shown in FIG. 8A), as well as in the trenches 228 between the remaining semiconductor stack in the nanosheet region (shown in FIG. 8C), by an epitaxy process which grows faster in the 100 direction compared to the 110 direction. A cyclic epi-etch back process may be used to ensure that the epi growth from exposed sidewalls of nanosheets can be suppressed.

Figure 9A:
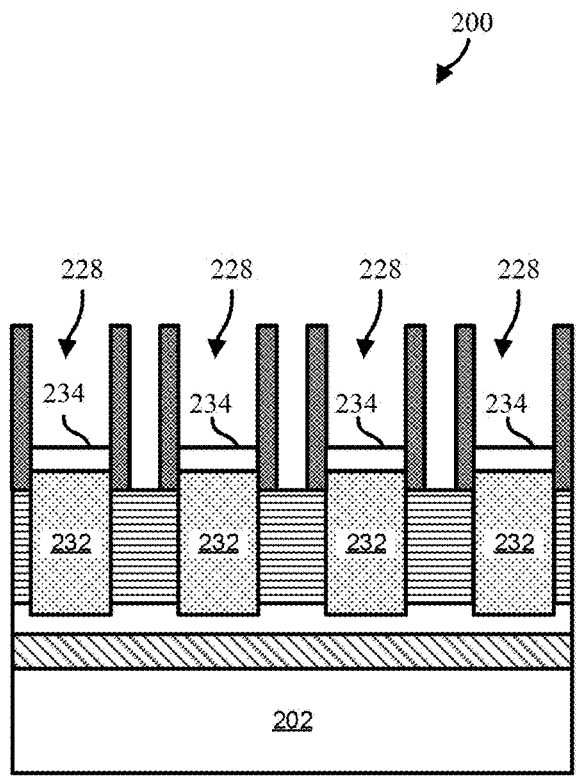
FIGS. 9A-9C illustrate cross-sectional views of the semiconductor device of FIGS. 8A-8C following the performance of additional fabrication operations, in accordance with embodiments of the present disclosure.
Figure 9B:
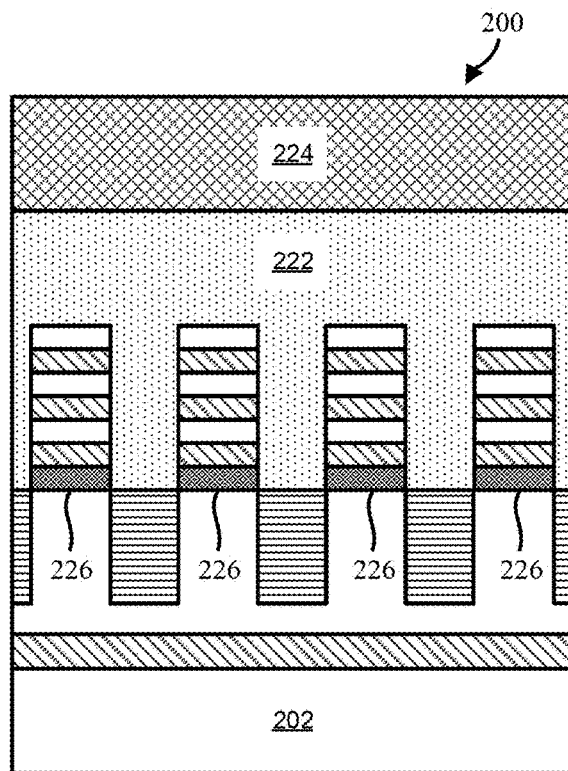
Figure 9C:
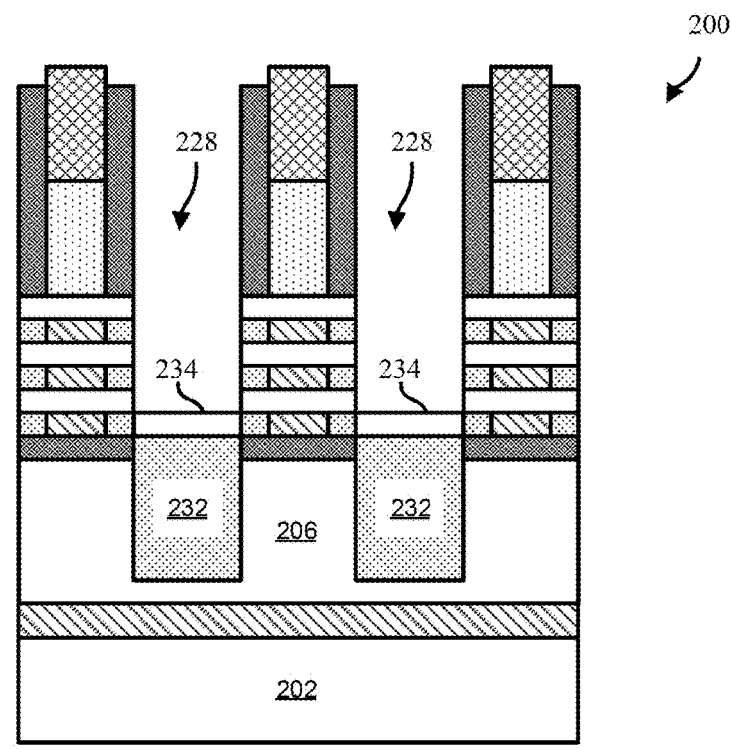
Figure 10A:
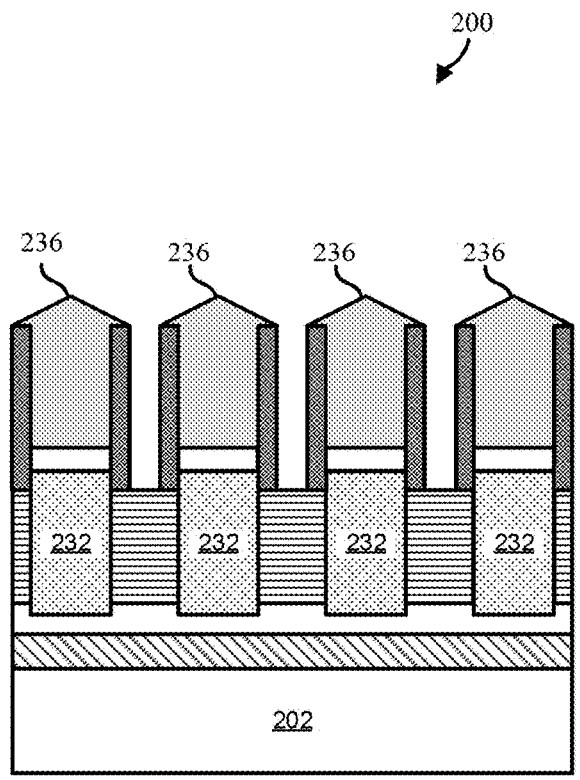
FIGS. 10A-10C illustrate cross-sectional views of the semiconductor device of FIGS. 9A-9C following the performance of additional fabrication operations, in accordance with embodiments of the present disclosure.
Figure 10B:
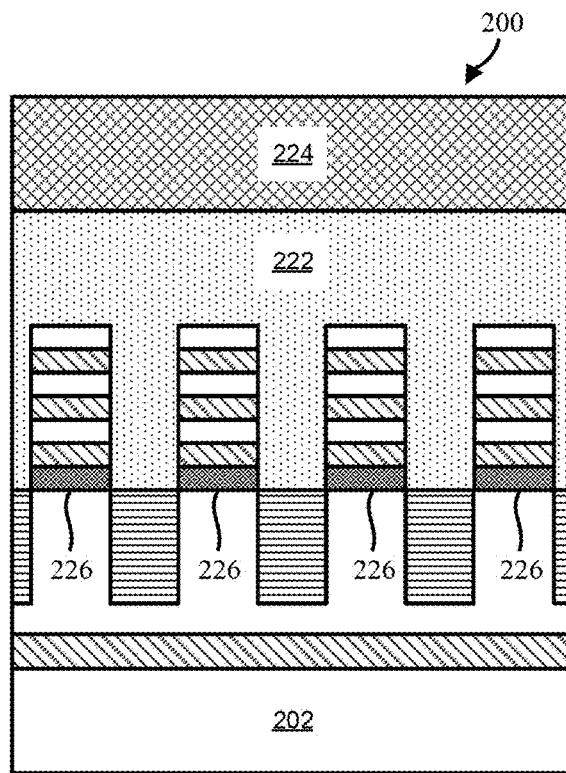
Figure 10C:
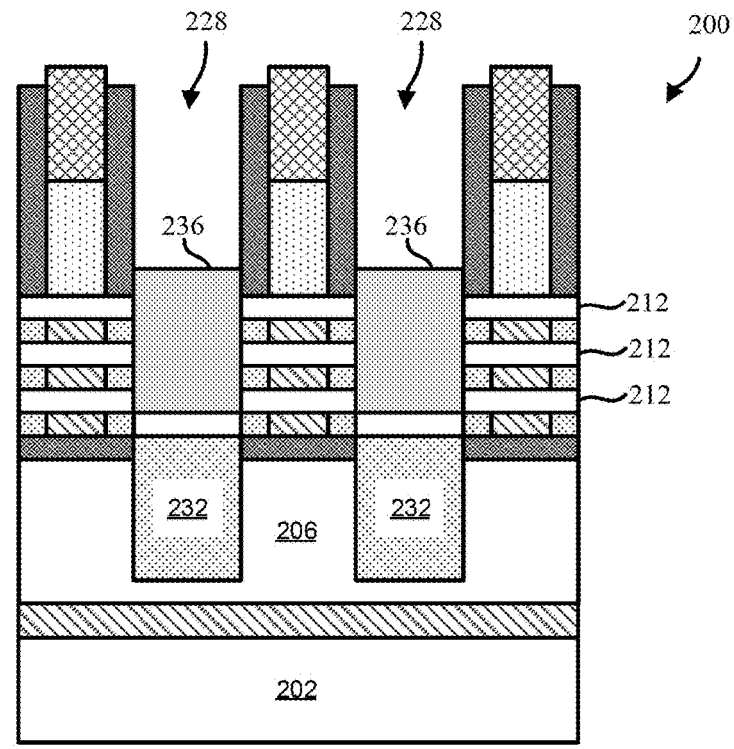

An Si buffer epitaxy 234 may then been grown on top of the sacrificial placeholder 232. This is shown in FIGS. 9A-9C. A source/drain epitaxy 236 is then grown on top of the Si buffer epitaxy 234. This is shown in FIGS. 10A-10C. As shown in FIG. 10A, the source/drain epitaxy 236 overtops the sidewall spacers 226 in the inter-gate region. Furthermore, as shown in FIG. 10C, the source/drain epitaxy 236 extends above the top of the nanosheet stack. In other words, the top surface of the source-drain epitaxy 236 is above the top of the uppermost Si layer 212.

After growing the source/drain epitaxy 236, an ILD fill operation may be performed to create an ILD layer 238, which may then be planarized using a CMP process. Additionally, the dummy gate 222 may be removed, the remaining third sacrificial material 210 may be released, a gate cut may be performed, and the high-k metal gate (HKMG) 240 may be formed. This is shown in FIGS. 11A-11C.

Figure 11A:
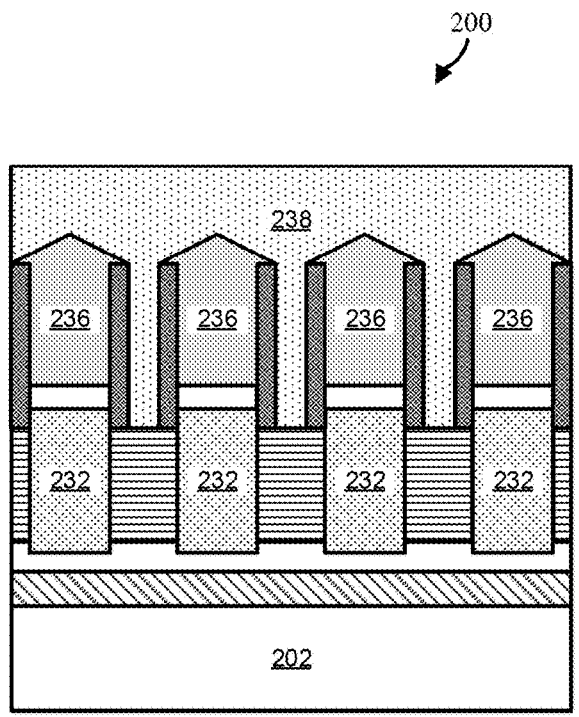
FIGS. 11A-11C illustrate cross-sectional views of the semiconductor device of FIGS. 10A-10C following the performance of additional fabrication operations, in accordance with embodiments of the present disclosure.

The ILD 238 may surround and cover the source/drain epitaxy 236, the STI 216, and the spacer sidewalls 226 in the inter-gate region, as shown in FIG. 11A. Likewise, the ILD 238 may fill in the rest of the trenches 228 (shown in FIGS. 10A-10C), as shown in FIG. 11C. The planarization process may expose the top portions of the ILD 238, the sidewall spacers 226, and the metal gate 240, as shown in FIG. 11C.

The ILD 238 can include any suitable material(s) known in the art, such as, for example, porous silicates, carbon doped oxides, silicon dioxides, silicon nitrides, silicon oxynitrides, or other dielectric materials. The ILD 238 can be formed using any method known in the art, such as, for example, chemical vapor deposition, plasma enhanced chemical vapor deposition, atomic layer deposition, or physical vapor deposition.

Figure 11B:
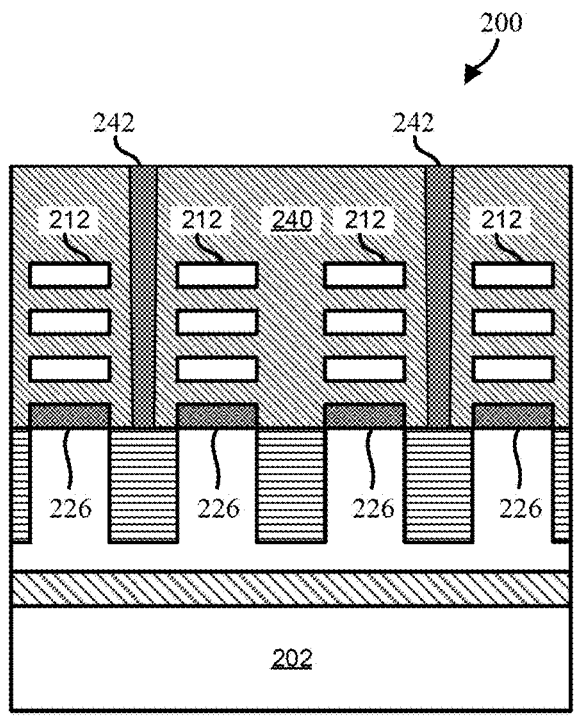
Figure 11C:
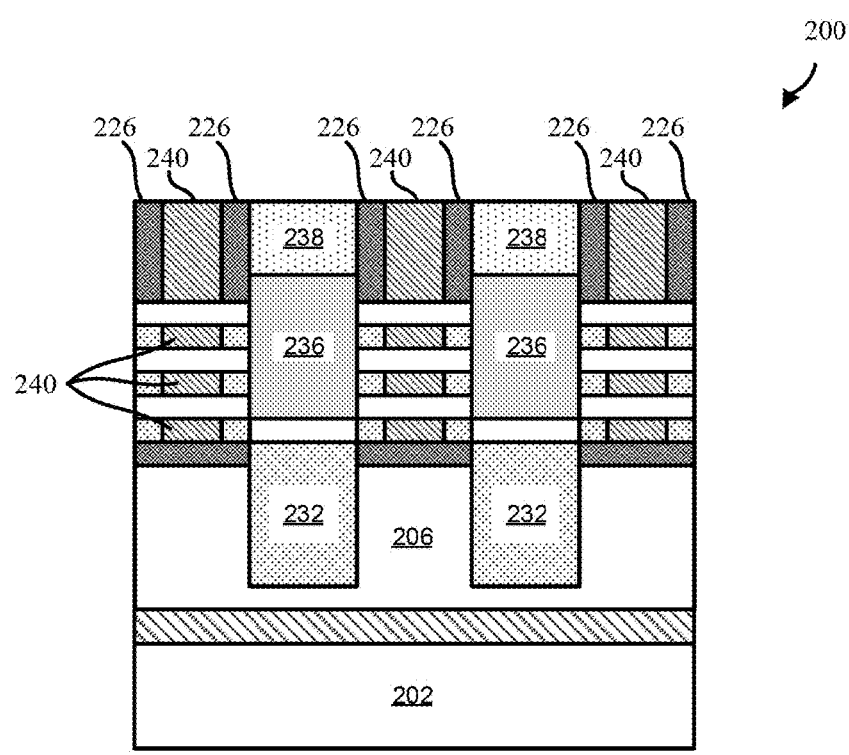

After releasing the third sacrificial layers 210, the HKMG layer 240 is formed on top of and around the remaining semiconductor material 212 in the gate region, as shown in FIG. 11B. In other words, during this stage, a replacement high-k metal gate is formed in place of each dummy gate 222 and SiGe layers 210. The HKMG layer 240 includes the high-k dielectric such as HfO2, ZrO, HfLaOx, HfAlOx, etc, and workfunction metal (WFM) such as TiN, TiC, TiAlC, TiAl, etc and it may further comprise optional low resistance conducting metals such as W, Co and Ru.

Those skilled in the art will recognize that a "replacement metal gate" refers to a gate, which replaces a previously formed dummy gate (also referred to herein as a sacrificial gate, a non-active gate, or a non-gate) and becomes an active component of the semiconductor structure being formed. The work function metal can comprise a metal selected so as to have a specific work function appropriate for a given type FET (e.g., an N-type FET or a P-type FET). For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon. For a silicon-based P-type FET, the work function metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the work function metal has a work function similar to that of P-doped polysilicon.

Additionally, gate cut regions 242 may be formed in the metal gate 240 to electrically isolate the various FETs. The gate cut regions 242 may be formed of any suitable material to prevent shorting across the nanosheet transistors. The gate cut regions 242 may extend upward from the STI 216 to the top of the semiconductor device 200 (i.e., be coplanar with the top of the metal gate 240).

Figure 12A:
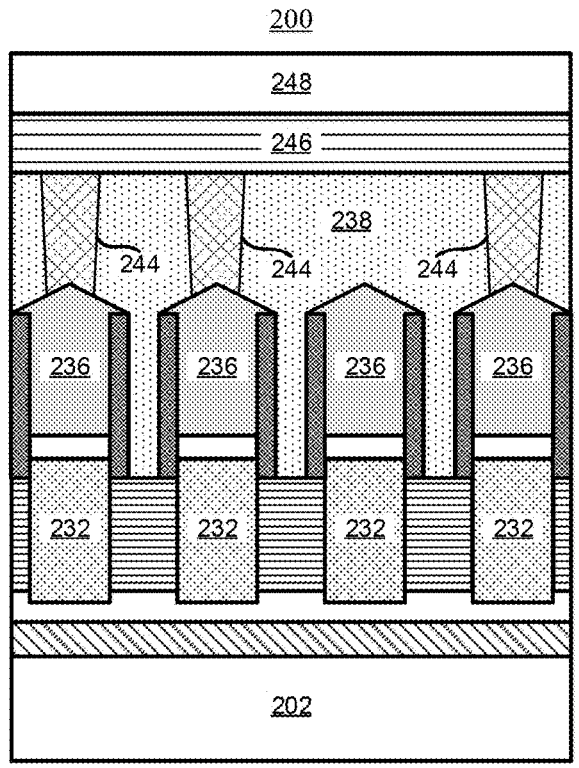
FIGS. 12A-12C illustrate cross-sectional views of the semiconductor device of FIGS. 11A-11C following the performance of additional fabrication operations, in accordance with embodiments of the present disclosure.
Figure 12B:
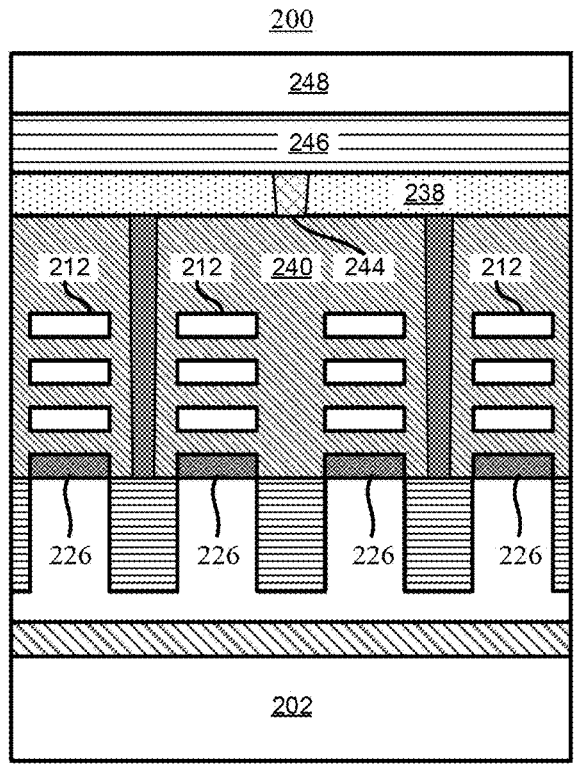
Figure 12C:
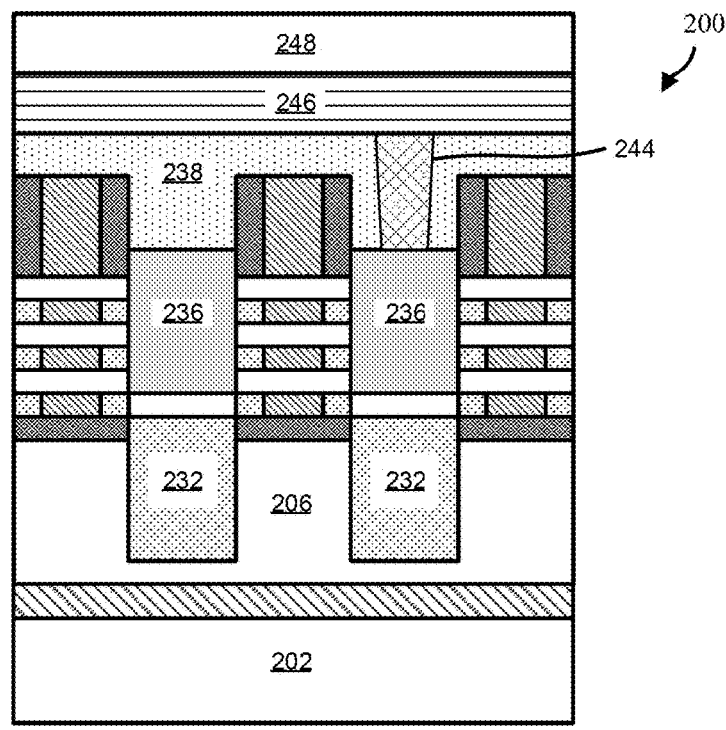

Next, the middle-of-line (MOL) and back-end-of-line (BEOL) 246 structures may be formed. The semiconductor device 200 may then be bonded to a carrier wafer 248. This is illustrated in FIGS. 12A-12C. The MOL structures may include one or more epitaxy and/or gate contacts 244, as well as another ILD layer 238 deposited on top of the semiconductor device 200 (e.g., as shown in FIG. 12B, in which an ILD layer 238 is on top of the metal gate 240). The epitaxy contacts 244 may be made out of any suitable material including, for example, a silicide liner at bottom of the contact such as Ti, Ni, NiTi, NiPt, and a conductive metal such as Ru or W, or Co, with a thin adhesion metal liner such as TiN. The BEOL 246 may include a number of interconnects or other structures.

It is to be understood that the dimensions of the MOL and BEOL 246 structures, as well as the carrier wafer 248, are not necessarily drawn to scale. The MOL and BEOL 246 structures and the carrier wafer 248 may be formed using any suitable processes, as would be recognized by a person of ordinary skill in the art. In some embodiments, BEOL 246 and carrier wafer 248 may be pre-fabricated and then bonded with the semiconductor device 200.

Figure 13A:
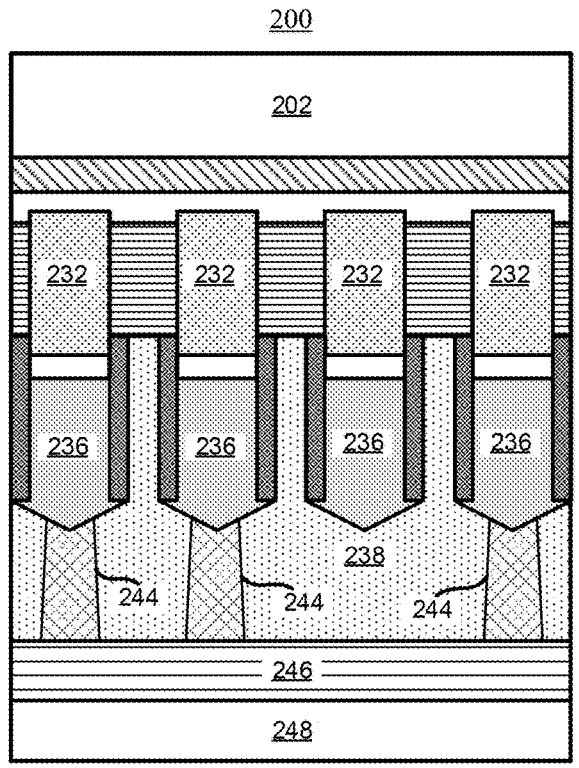
FIGS. 13A-13C illustrate cross-sectional views of the semiconductor device of FIGS. 12A-12C following the performance of additional fabrication operations, in accordance with embodiments of the present disclosure.
Figure 13B:
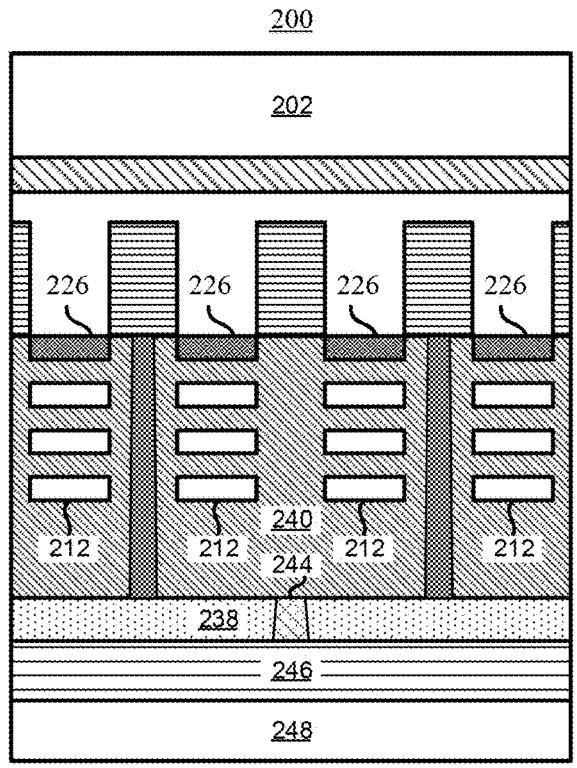
Figure 13C:
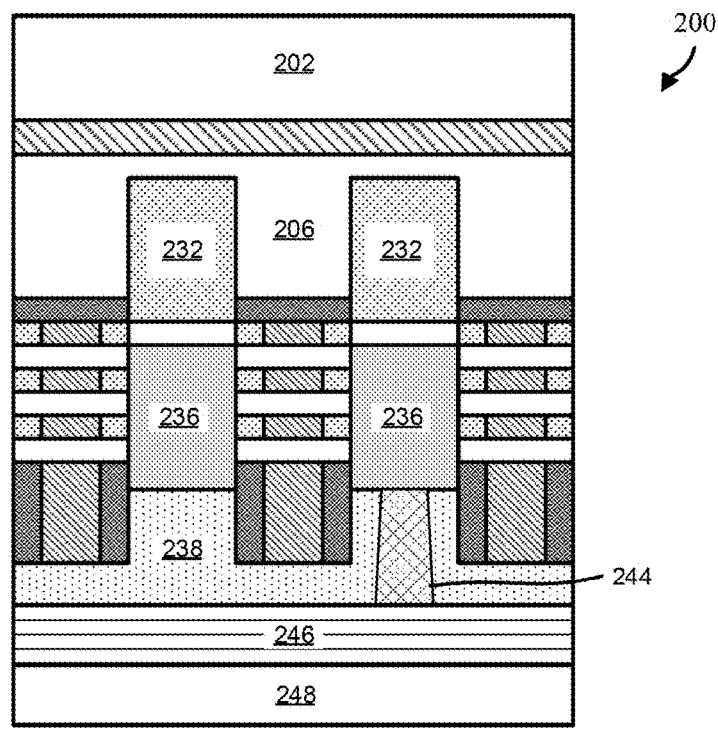
Figure 15A:
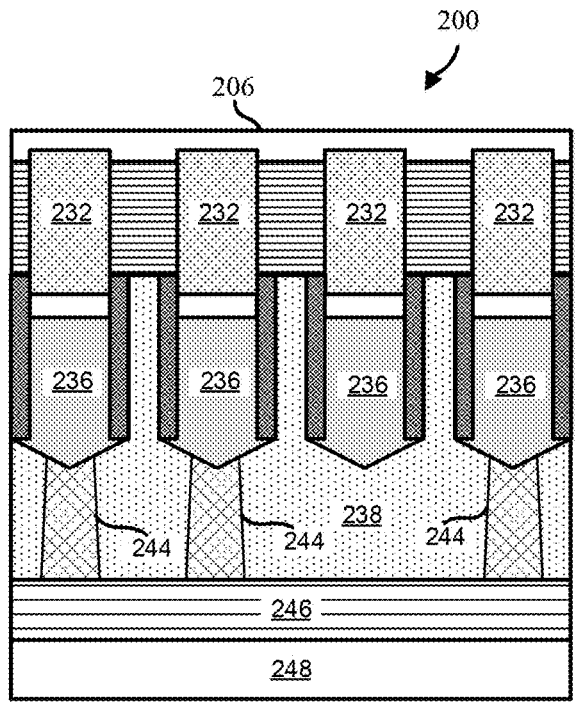
FIGS. 15A-15D illustrate cross-sectional views of the semiconductor device of FIGS. 14A-14D following the performance of additional fabrication operations, in accordance with embodiments of the present disclosure.
Figure 15B:
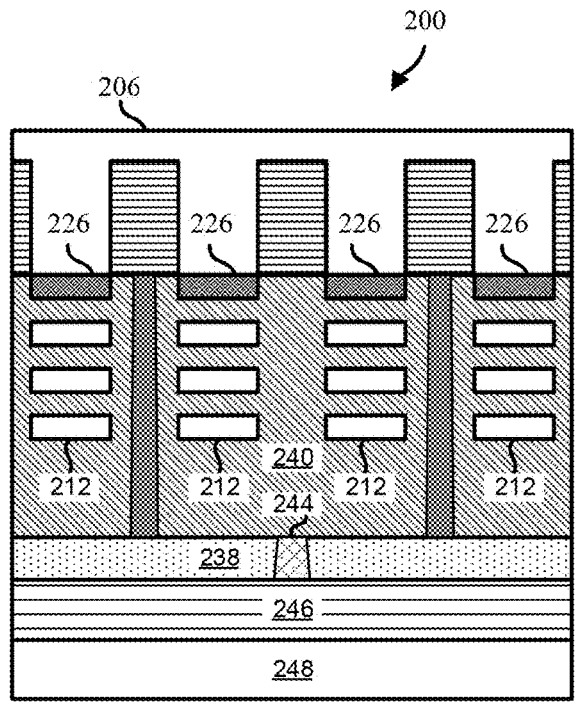
Figure 15C:
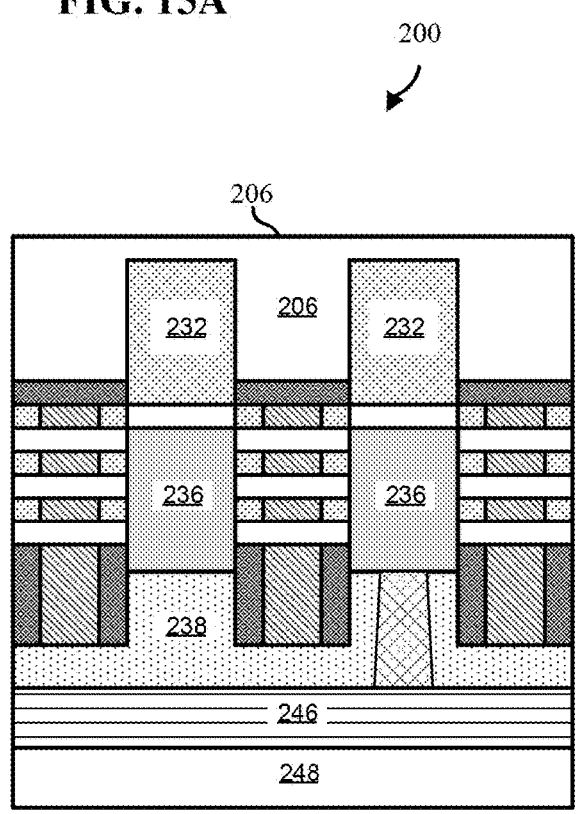
Figure 15D:
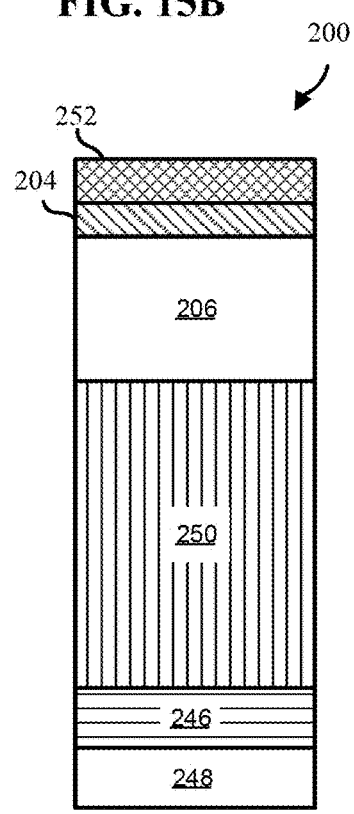

Next, the wafer is flipped. This is shown in FIGS. 13A-13C. After flipping the wafer, the substrate 202 is removed. This is shown in FIGS. 14A-14D. The substrate 202 may be removed through a selective etching process that stops on the first sacrificial layer 204, which acts as an etch stop. As shown in FIG. 14D, the substrate 202 is also removed from the secondary device region of the semiconductor device 200. Following removal of the substrate 202, the secondary device region includes the first sacrificial layer 204, the semiconductor layer 206, one or more other devices 250, the BEOL 246, and the carrier wafer 248. The one or more other devices include other devices formed on the same wafer as the transistor. The other device may include, for examples, an ESD diode, a BJT, or another device (e.g., a passive device) built on the bulk substrate.

Figure 16A:
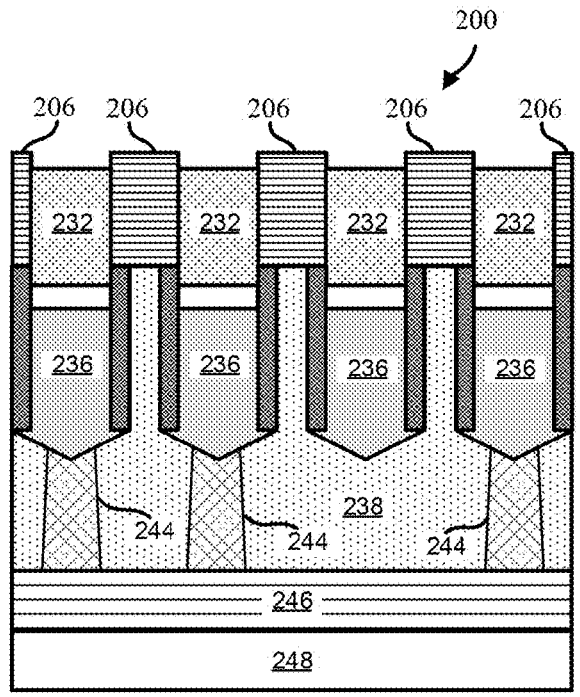
FIGS. 16A-16D illustrate cross-sectional views of the semiconductor device of FIGS. 15A-15D following the performance of additional fabrication operations, in accordance with embodiments of the present disclosure.
Figure 16B:
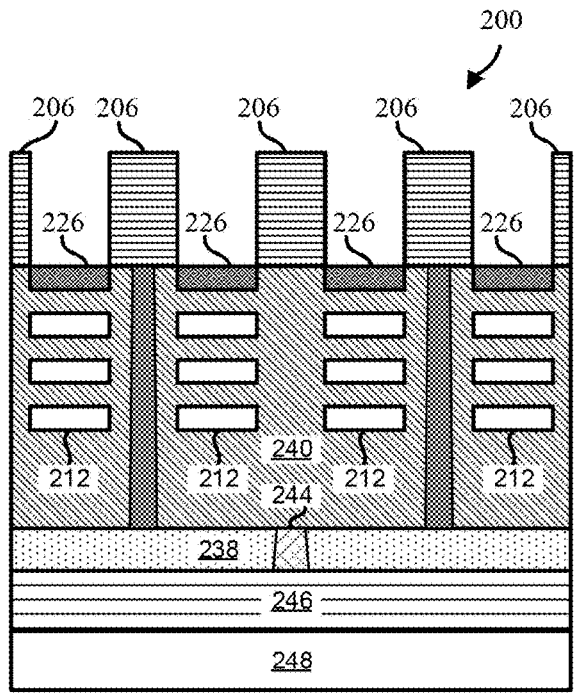
Figure 16C:
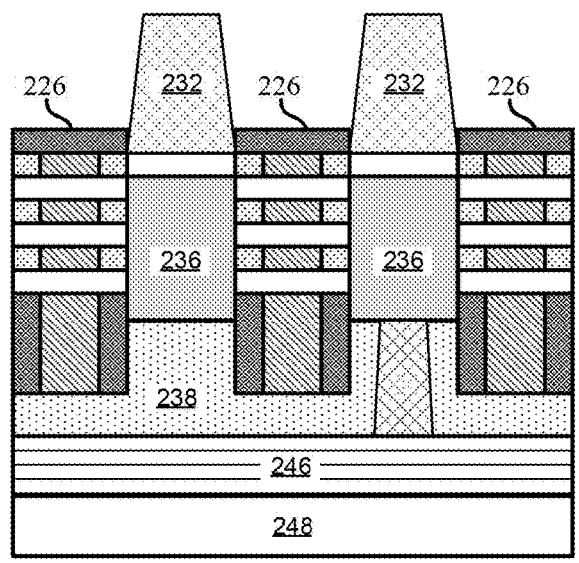
Figure 16D:
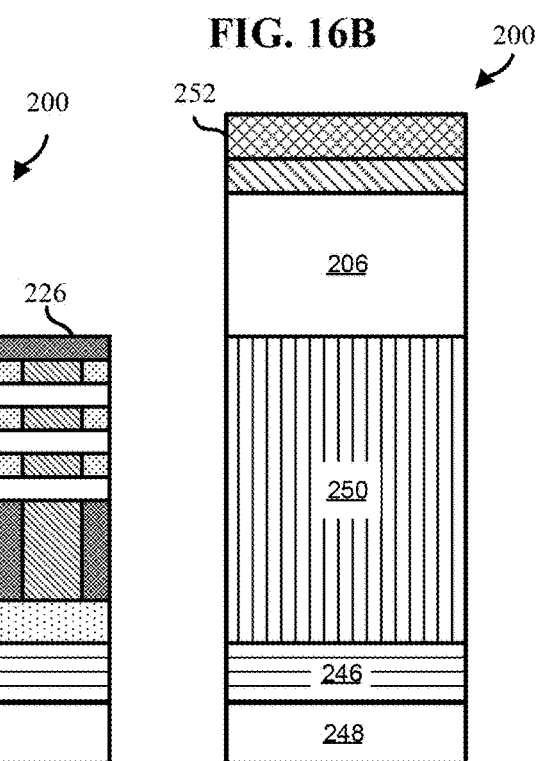

Next, the secondary device region may have a hardmask 252 deposited thereon, and a patterning process may be performed to remove the etch stop (i.e., the first sacrificial layer 204) from the transistor region. This is shown in FIGS. 15A-15D. The semiconductor layer 206 is then removed selective to the SiGe. This is shown in FIGS. 16A-16D. Selective removal of the semiconductor layer 206 exposes the STI 216 and the sacrificial epitaxy placeholders 232, as shown in FIGS. 16A-16C. In regions where the sacrificial epitaxy placeholders 232 are not abutted by STI 216, the selective etching process may change the profile of the sacrificial epitaxy placeholders 232, as shown in FIG. 16C.

Next, a backside ILD fill process and CMP process may be performed. This is shown in FIGS. 17A-17D. As shown in FIGS. 17A-17C, the ILD 254 fill may be deposited on top of and around the STI 216, the epitaxy placeholders 232, and the BDI 226 (in the gate region shown in FIG. 18B). The CMP process may then planarize the top of the semiconductor device 200 such that the top of the ILD 254 is coplanar with the top of the hardmask 252 in the secondary device region.

Backside contact patterning may then be performed. This is shown in FIGS. 18A-18D. In particular, trenches 256 may be patterned into the through the ILD 254 and into the epitaxy placeholders 232 in areas where backside contacts are to be formed. Portions of the STI 216 may also be removed by this process. This process allows for much better tolerance in the critical dimensions (CD) and overlay when compared to traditional processes.

Next, the epitaxy placeholders 232 that are exposed are removed and a precontact clean is performed to smooth the corners 257. This is shown in FIGS. 19A-19D. Additionally, the Si buffer epitaxy 234 is removed from the contact areas. Because the trenches 256 are formed by patterning on top of sacrificial epitaxy placeholders 232 and then removing the placeholders 232, the resulting trenches 256 are two-stage trenches, with the top portion of the trench 256 being larger than the bottom portion.

Figure 20B:
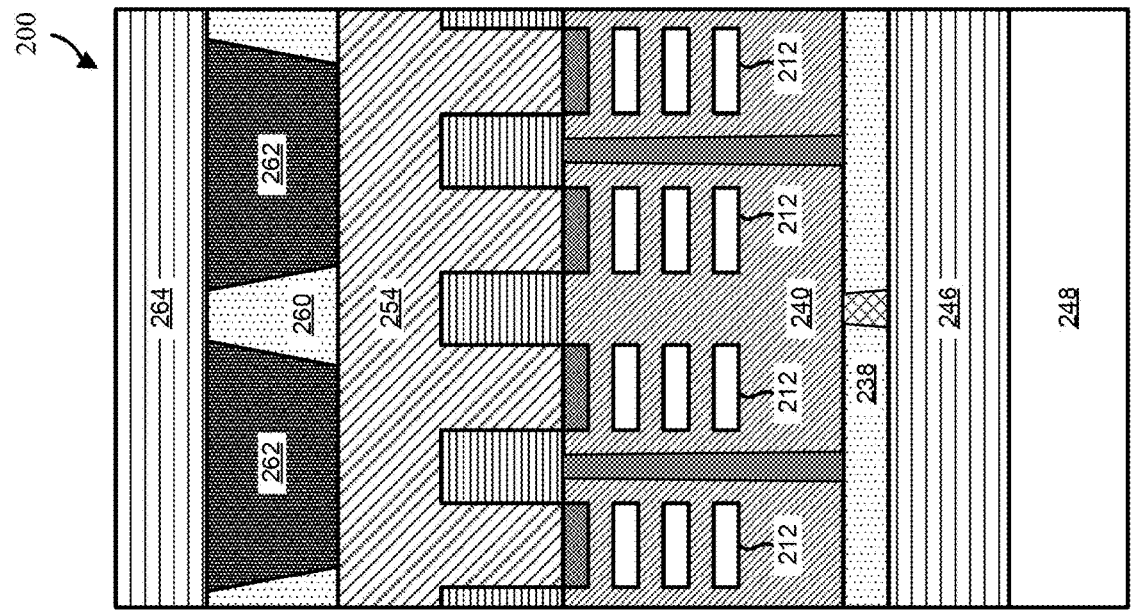
FIGS. 20A-20D illustrate cross-sectional views of the semiconductor device of FIGS. 19A-19D following the performance of additional fabrication operations, in accordance with embodiments of the present disclosure.
Figure 20A:
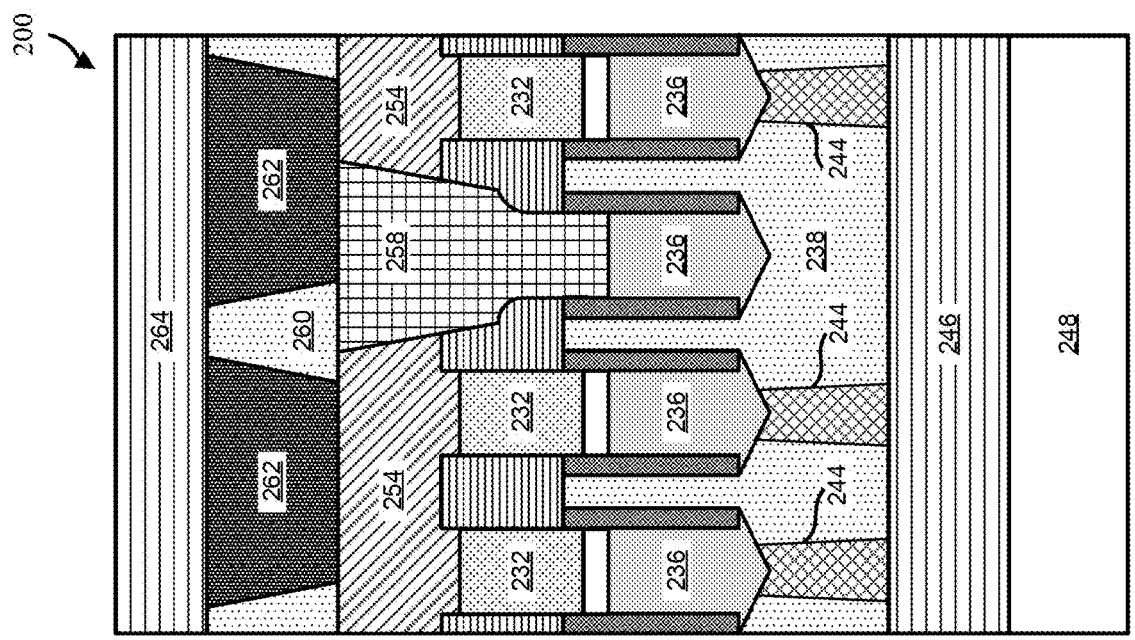
Figure 20C:
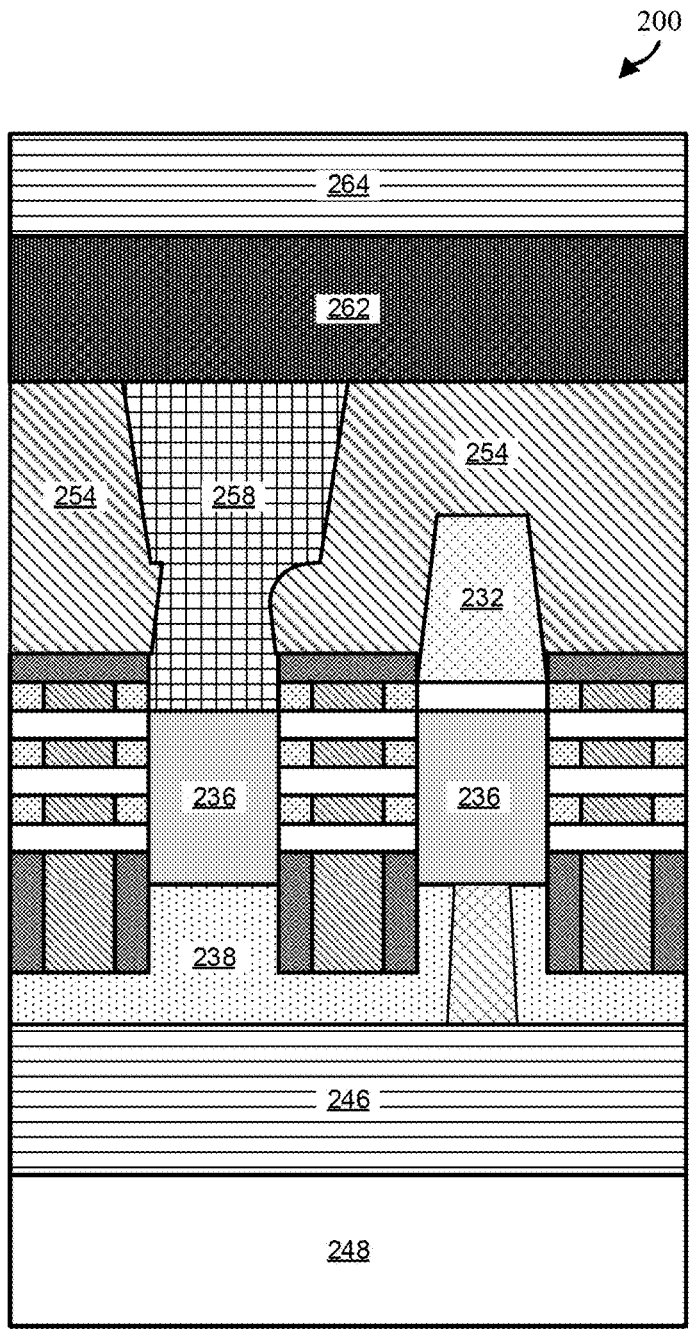
Figure 20D:
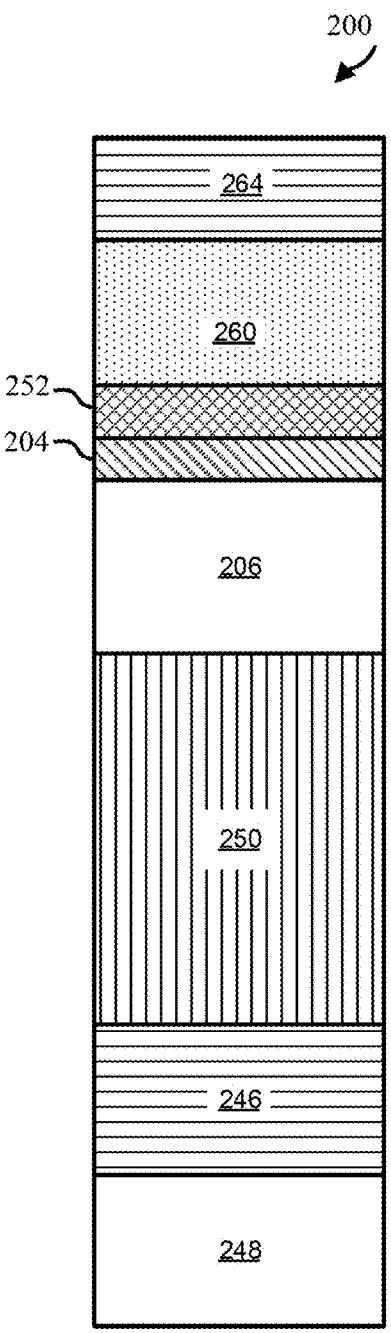

Following the precontact clean, backside contacts 258 are formed in the trenches 256. This is shown in FIGS. 20A-20D. The backside contacts 258 may be formed of any suitable conductive material such as, a silicide liner at bottom of the contact such as Ti, Ni, NiTi, NiPt, and conductive metal such as Ru or W, or Co, with a thin adhesion metal liner such as TiN. Additionally, an ILD 260 layer may be formed on top of the ILD 254 and the contacts 258 in the inter-gate region, as shown in FIG. 20A. BPRs 262 may then be formed in the ILD 260. The BPRs 262 may include a Vss and a Vdd BPR 262. The Vdd BPR 262 may be formed at least partially on top of the backside contact 258, as shown in FIGS. 20A and 20C. The BSPDN 264 is then formed on top of the BPRs 262.

Figure 21:
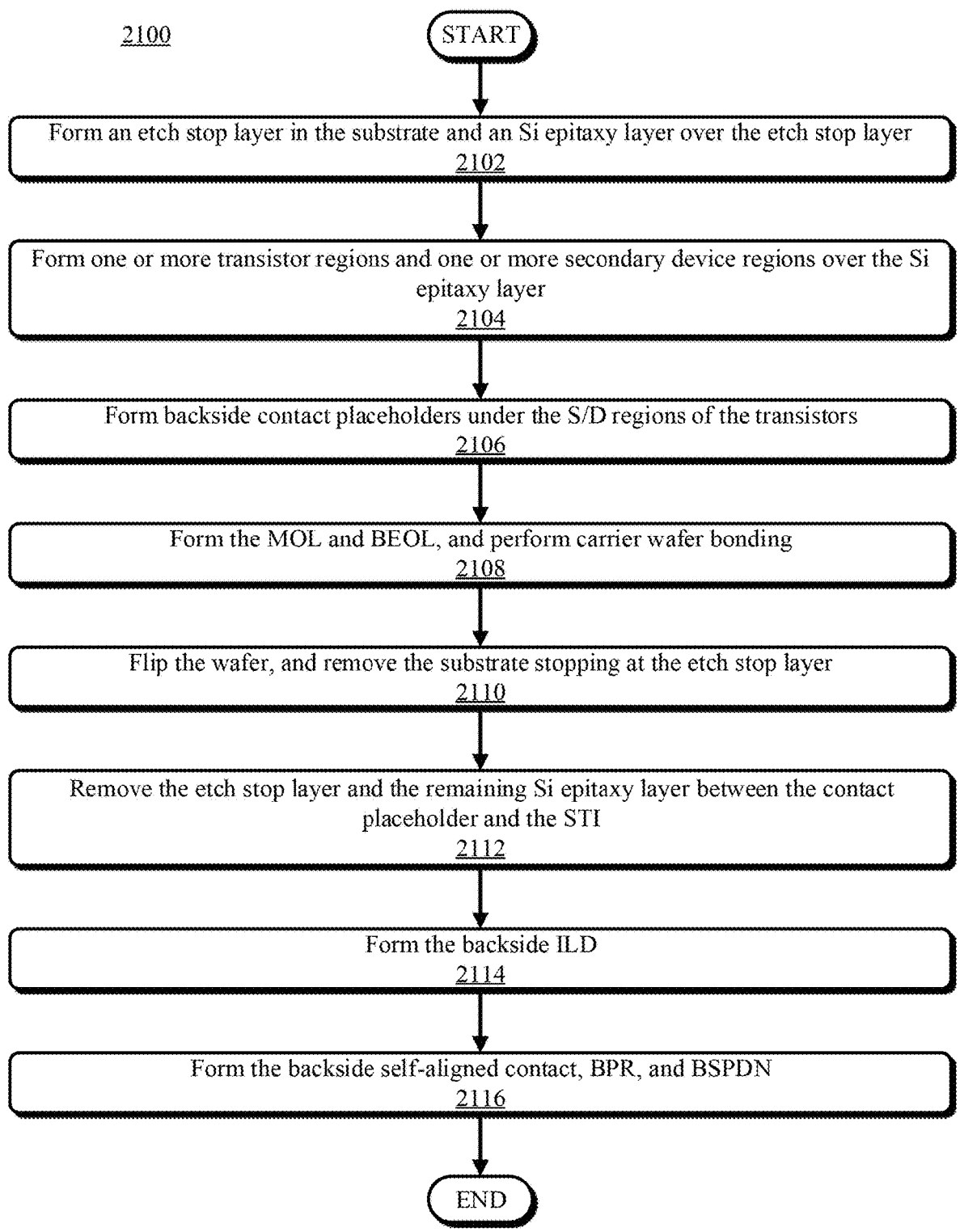
FIG. 21 illustrates a flowchart of an example method for forming a semiconductor device, in accordance with embodiments of the present disclosure.

Referring now to FIG. 21, illustrated is a flowchart of an example method 2100 for forming a semiconductor device, in accordance with embodiments of the present disclosure. The method 2100 may be performed by, for example, hardware, software, firmware, or any combination thereof. For example, the method 2100 may be performed by computer systems of a semiconductor fabrication plant controlling fabrication equipment.

The method may begin at operation 2102, wherein an etch stop layer (e.g., SiGe30% or BOX $SiO_2$) is formed in a substrate. An Si epitaxy layer (e.g., Si layer 206 shown in FIG. 2) is then formed over the etch stop layer.

At operation 2104, one or more transistor regions and one or more secondary device regions are then formed over the Si epitaxy layer. Each of the one or more transistor regions may further include an inter-gate region, a gate region, and a nanosheet region, as discussed herein. The one or more transistor regions may be regions where transistors (e.g., CFETs) with self-aligned backside contacts may be formed, as discussed here. The one or more secondary device regions may be regions where other devices (e.g., ESD diodes, BJTs, other passive devices) are formed on the bulk substrate. The one or more secondary device regions and the one or more transistor regions may be at the same level (e.g., in the PCB stack) as each other.

At operation 2106, backside contact placeholders are formed under the source/drain regions of the transistors. The backside contact placeholders may be formed out of a sacrificial material, such as an SiGe material.

At operation 2108, the MOL and BEOL are formed, and the semiconductor device is bonded to a carrier wafer. The wafer is then flipped, and the substrate is removed stopping at the etch stop layer. This is shown in operation 2110.

Next, at operation 2112, the etch stop layer and the remaining Si epitaxy layer are removed between the contact placeholder and the STI. This may be performed in the transistor region only. In order to selectively perform these steps, operation 2112 may further include applying a hardmask on the secondary device regions.

The backside ILD is then formed at operation 2114. After forming the backside ILD, the backside self-aligned contacts, the BPRs, and the BSPDN are formed at operation 2116. The BPRs may connect to the transistor via the backside self-aligned contacts. After forming the backside contacts, the BPRs, and the BSPDN, the method 2100 may end.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

As discussed herein, embodiments of the present disclosure include a method. The method may be performed by, for example, a computer system that control semiconductor fabrication machinery. As such, the method may be embodied as a computer program product having software instructions on a storage medium. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., $100a$, $100b$, $100c$) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

A non-limiting list of Example Embodiments is provided hereinafter to demonstrate some aspects of the present disclosure.

Example Embodiment 1 is a semiconductor device. The device includes a transistor comprising a plurality of source/drain epitaxies. The device further comprises at least one backside power rail under the transistor. The device further comprises a backside inter-layer dielectric (ILD) located between the plurality of source/drain epitaxies and the at least one power rail. The device further comprises a first backside contact connecting a first source/drain epitaxy to the at least one backside power rail. The device further comprises one or more contact placeholders formed under the other source/drain epitaxies.

Example Embodiment 2 includes the device of Example Embodiment 1, including or excluding optional features. In this Example Embodiment, the semiconductor device comprises a transistor region and a secondary device region, the transistor region comprising the transistor. Optionally, the secondary device region includes one or more other devices selected from the group consisting of an ESD diode, a BJT, and a passive device. Optionally, the device includes a Si substrate under the one or more other devices in the secondary device region. Optionally, the device includes an etch stop layer underneath the Si substrate in the secondary device region. Optionally, the transistor region further comprises one or more additional transistors. Optionally, a pair of transistors in the transistor region are connected to create complementary metal-oxide semiconductor (CMOS) cells, the pair of transistors comprising an n-type transistor and a p-type transistor. Optionally, the pair of transistors form a complementary field-effect transistor (CFET).

Example Embodiment 3 includes the device of any one of Example Embodiments 1 to 2, including or excluding optional features. In this Example Embodiment, the first backside contact has a two-staged shape, wherein the first backside contact has a larger top critical dimensions (CD) and smaller bottom CD.

Example Embodiment 4 includes the device of any one of Example Embodiments 1 to 3, including or excluding optional features. In this Example Embodiment, each source/drain epitaxy of the plurality of source/drain is either connected to a backside power rail through a backside contact or is connected to a contact placeholder.

Example Embodiment 5 includes the device of any one of Example Embodiments 1 to 4, including or excluding optional features. In this Example Embodiment, the device includes a bottom dielectric isolation layer between the backside ILD and a gate stack of the transistor.

Example Embodiment 6 includes the device of any one of Example Embodiments 1 to 5, including or excluding optional features. In this Example Embodiment, the device includes a shallow trench isolation (STI) layer under the channels of the transistor, wherein the STI layer is surrounded by the backside ILD in the gate region. Optionally, the STI layer separates the one or more contact placeholders and the first contact from each other.

Example Embodiment 7 includes the device of any one of Example Embodiments 1 to 6, including or excluding optional features. In this Example Embodiment, the device includes a backside power distribution network (BSPDN) connected to the at least one backside power rail opposite the transistor.

Example Embodiment 8 includes the device of any one of Example Embodiments 1 to 7, including or excluding optional features. In this Example Embodiment, the transistor is a nanosheet transistor.

Example Embodiment 9 is a nanosheet transistor. The nanosheet transistor includes a plurality of source/drain epitaxies. The nanosheet transistor further includes a backside ILD under the plurality of source/drain epitaxies. The nanosheet transistor further includes a first contact connecting a first source/drain epitaxy to a backside power rail, the first contact extending through the backside ILD. The nanosheet transistor further includes a contact placeholder in contact with a second source/drain epitaxy. The contact placeholder is disposed between the second source/drain epitaxy and the backside ILD.

Example Embodiment 10 includes the nanosheet transistor of Example Embodiment 9, including or excluding optional features. In this Example Embodiment, the nanosheet transistor further includes a frontside ILD above the plurality of source/drain epitaxies. The frontside ILD is disposed between the plurality of source/drain epitaxies and a back-end-of-line (BEOL) portion of a semiconductor device. Optionally, the nanosheet transistor includes one or more BEOL contacts, each of the one or more BEOL contacts connecting a source/drain epitaxy of the plurality of source/drain epitaxies to the BEOL. Optionally, the one or more BEOL contacts include a first BEOL contact that connects the second source/drain epitaxy to the BEOL.

Example Embodiment 11 is a semiconductor device. The device includes a backside power distribution network (BSPDN) and one or more backside power rails connected to the BSPDN. The device further includes an ILD above the one or more backside power rails, opposite the BSPDN. The device further includes one or more nanosheet transistors. Each nanosheet transistor comprises at least one backside contact that connects a first source/drain epitaxy of the respective nanosheet transistor to a backside power rail. The backside contact extends from the source/drain epitaxy through the backside ILD. Each nanosheet transistor further includes at least one placeholder contact connected to a second source/drain epitaxy.

Example Embodiment 12 includes the device of Example Embodiment 11, including or excluding optional features. In this Example Embodiment, the device includes a BEOL section connected to the one or more nanosheet transistors opposite the backside ILD. Each nanosheet transistor further comprises one or more BEOL contacts, each of the BEOL contacts connecting a source/drain epitaxy of the respective transistor to the BEOL section.

Example Embodiment 13 is a method of fabricating a semiconductor device. The method includes forming an etch stop layer on a substrate. The method further includes forming an Si epitaxy layer over the etch stop layer. The method further includes forming one or more transistor regions and one or more secondary device regions over the Si epitaxy layer. The method further includes forming backside contact placeholders under source/drain regions of the one or more transistors. The method further includes forming middle-of-line (MOL) and BEOL sections. The method further includes selectively removing the substrate to the etch stop layer. The method further includes removing the etch stop layer and the Si epitaxy layer from the one or more transistor regions. The method further includes forming a backside ILD. The method further includes forming one or more backside contacts through the backside ILD. The method further includes forming one or more backside power rails and a backside power distribution network over the one or more backside contacts.

Example Embodiment 14 includes the method of Example Embodiment 13, including or excluding optional features. In this Example Embodiment, forming the one or more transistor regions comprises forming one or more nanosheet transistors. Additionally, in this Example Embodiment, forming the one or more secondary device regions comprises forming one or more devices selected from the group consisting of ESD diodes and BJTs.

Example Embodiment 15 includes the method of any one of Example Embodiments 13 to 14, including or excluding optional features. In this Example Embodiment, removing the etch stop layer and the Si epitaxy layer from the one or more transistor regions comprises applying a hardmask over the one or more secondary device regions, removing the etch stop layer in a first etching operation, and removing the Si epitaxy layer in a second etching operation.

Example Embodiment 16 is a computer program product for forming a semiconductor device using one or more fabrication manufacturing components. The computer program product includes instructions that direct the processor to perform a method. The method includes forming an etch stop layer on a substrate. The method further includes forming an Si epitaxy layer over the etch stop layer. The method further includes forming one or more transistor regions and one or more secondary device regions over the Si epitaxy layer. The method further includes forming backside contact placeholders under source/drain regions of the one or more transistors. The method further includes forming middle-of-line (MOL) and BEOL sections. The method further includes selectively removing the substrate to the etch stop layer. The method further includes removing the etch stop layer and the Si epitaxy layer from the one or more transistor regions. The method further includes forming a backside ILD. The method further includes forming one or more backside contacts through the backside ILD. The method further includes forming one or more backside power rails and a backside power distribution network over the one or more backside contacts.

What is claimed is:

1. A semiconductor device comprising:
   a transistor comprising a plurality of source/drain epitaxies; and
   at least one backside power rail under the transistor;
   a backside inter-layer dielectric (ILD) located between the plurality of source/drain epitaxies and the at least one power rail;
   a first backside contact connecting a first source/drain epitaxy to the at least one backside power rail;
   one or more contact placeholders formed under the other source/drain epitaxies; and
   a backside power distribution network (BSPDN) connected to the at least one backside power rail opposite the transistor.

2. The semiconductor device of claim 1, wherein the semiconductor device comprises a transistor region and a secondary device region, the transistor region comprising the transistor.

3. The semiconductor device of claim 2, wherein the secondary device region includes one or more other devices selected from the group consisting of an ESD diode, a BJT, and a passive device.

4. The semiconductor device of claim 2, further comprising a Si substrate under the one or more other devices in the secondary device region.

5. The semiconductor device of claim 2, wherein the transistor region further comprises one or more additional transistors.

6. The semiconductor device of claim 5, wherein a pair of transistors in the transistor region are connected to create complementary metal-oxide semiconductor (CMOS) cells, the pair of transistors comprising an n-type transistor and a p-type transistor.

7. The semiconductor device of claim 6, wherein the pair of transistors form a complementary field-effect transistor (CFET).

8. The semiconductor device of claim 1, wherein the first backside contact has a two-staged shape, wherein the first backside contact has a larger top critical dimensions (CD) and smaller bottom CD.

9. The semiconductor device of claim 1, wherein each source/drain epitaxy of the plurality of source/drain is either connected to a backside power rail through a backside contact or is connected to a contact placeholder.

10. The semiconductor device of claim 1, further comprising:
    a bottom dielectric isolation layer between the backside ILD and a gate stack of the transistor.

11. The semiconductor device of claim 1, wherein the transistor is a nanosheet transistor.

12. A nanosheet transistor comprising:
    a plurality of source/drain epitaxies;
    a backside ILD under the plurality of source/drain epitaxies;
    a first contact connecting a first source/drain epitaxy to a backside power rail, the first contact extending through the backside ILD; and
    an epitaxy placeholder in contact with a second source/drain epitaxy, the epitaxy placeholder being disposed between the second source/drain epitaxy and the backside ILD.

13. The nanosheet transistor of claim 12, further comprising:
    a frontside ILD above the plurality of source/drain epitaxies, the frontside ILD being disposed between the plurality of source/drain epitaxies and a back-end-of-line (BEOL) portion of a semiconductor device.

14. The nanosheet transistor of claim 13, further comprising:
    one or more BEOL contacts, each of the one or more BEOL contacts connecting a source/drain epitaxy of the plurality of source/drain epitaxies to the BEOL.

15. The nanosheet transistor of claim 14, wherein the one or more BEOL contacts include a first BEOL contact that connects the second source/drain epitaxy to the BEOL.

16. A semiconductor device comprising:
    a backside power distribution network (BSPDN);
    one or more backside power rails connected to the BSPDN;
    a backside ILD above the one or more backside power rails and opposite the BSPDN; and one or more nanosheet transistors, each nanosheet transistor comprising:
- at least one backside contact that connects a first source/drain epitaxy of the respective nanosheet transistor to a backside power rail, the backside contact extending from the source/drain epitaxy through the backside ILD; and
- at least one placeholder contact connected to a second source/drain epitaxy.

17. The semiconductor device of claim 16, further comprising:
- a BEOL section connected to the one or more nanosheet transistors opposite the backside ILD, wherein each nanosheet transistor further comprises one or more BEOL contacts, each of the BEOL contacts connecting a source/drain epitaxy of the respective transistor to the BEOL section.

* * * * *